US008955216B2

(12) United States Patent
Rathburn

(10) Patent No.: US 8,955,216 B2
(45) Date of Patent: Feb. 17, 2015

(54) METHOD OF MAKING A COMPLIANT PRINTED CIRCUIT PERIPHERAL LEAD SEMICONDUCTOR PACKAGE

(75) Inventor: James Rathburn, Mound, MN (US)

(73) Assignee: Hsio Technologies, LLC, Maple Grove, MN (US)

( * ) Notice: Subject to any disclaimer, the term of this patent is extended or adjusted under 35 U.S.C. 154(b) by 354 days.

(21) Appl. No.: 13/318,181

(22) PCT Filed: May 25, 2010

(86) PCT No.: PCT/US2010/036055
§ 371 (c)(1),
(2), (4) Date: Oct. 31, 2011

(87) PCT Pub. No.: WO2010/141266
PCT Pub. Date: Dec. 9, 2010

(65) Prior Publication Data
US 2012/0044659 A1    Feb. 23, 2012

Related U.S. Application Data

(60) Provisional application No. 61/183,365, filed on Jun. 2, 2009.

(51) Int. Cl.
*H05K 3/30* (2006.01)
*H01L 21/683* (2006.01)
(Continued)

(52) U.S. Cl.
CPC ........ *H01L 21/6835* (2013.01); *H01L 21/4867* (2013.01); *H01L 23/4985* (2013.01);
(Continued)

(58) Field of Classification Search
CPC .. H01L 21/4867; H01L 23/3107; H05K 3/20; H05K 3/4644; H05K 3/4652; H05K 3/4664

USPC ................... 29/830–834, 846, 847, 852, 841;
174/256, 260; 257/679; 361/776, 783;
438/464, 127
See application file for complete search history.

(56) References Cited

U.S. PATENT DOCUMENTS 3,672,986 A    6/1972  Schneble, Jr. et al.
4,188,438 A    2/1980  Burns
(Continued)

FOREIGN PATENT DOCUMENTS

JP    2003/217774    7/2003
WO    WO 91/14015    9/1991
(Continued)

OTHER PUBLICATIONS

Office Action mailed Feb. 21, 2014 in co-pending U.S. Appl. No. 13/266,573, now published as US Patent Application Publication No. 2012/0061846.

(Continued)

*Primary Examiner* — Donghai D Nguyen
(74) *Attorney, Agent, or Firm* — Stoel Rives LLP

(57) ABSTRACT

A compliant printed circuit semiconductor package including a compliant printed circuit with at least a first dielectric layer selectively printed on a substrate with first recesses. A conductive material is printed in the first recesses to form contact members accessible along a first surface of the compliant printed circuit. At least one semiconductor device is located proximate the first surface of the compliant printed circuit. Wirebonds electrically couple terminals on the semiconductor device to the contact members. Overmolding material seals the semiconductor device and the wirebonds to the first surface of the compliant printed circuit. Contact pads on a second surface of the compliant printed circuit are electrically coupled to the contact members.

13 Claims, 14 Drawing Sheets

(51) Int. Cl.
  *H01L 21/48* (2006.01)
  *H01L 23/498* (2006.01)
  *H01L 23/00* (2006.01)
  *H01L 25/065* (2006.01)
  *H05K 3/46* (2006.01)

(52) U.S. Cl.
  CPC ........... *H01L23/49822* (2013.01); *H01L 24/48* (2013.01); *H01L 25/0655* (2013.01); *H01L 2221/68345* (2013.01); *H01L 2224/48091* (2013.01); *H01L 2224/48235* (2013.01); *H01L 2225/0651* (2013.01); *H01L 2924/01004* (2013.01); *H01L 2924/01046* (2013.01); *H01L 2924/01078* (2013.01); *H01L 2924/01079* (2013.01); *H01L 2924/09701* (2013.01); *H01L 2924/12044* (2013.01); *H01L 2924/14* (2013.01); *H01L 2924/15174* (2013.01); *H01L 2924/19041* (2013.01); *H01L 2924/19042* (2013.01); *H01L 2924/19043* (2013.01); *H01L 2924/3011* (2013.01); *H01L 2924/3025* (2013.01); *H05K 3/4664* (2013.01); *H05K 3/4682* (2013.01); *H01L 2224/32225* (2013.01); *H01L 2224/48227* (2013.01); *H01L 2224/73265* (2013.01); *H01L 2924/30107* (2013.01)
  USPC ................. 29/841; 29/832; 29/846; 174/160; 438/127

(56) References Cited

U.S. PATENT DOCUMENTS

| | | | |
|---|---|---|---|
| 4,489,999 A | 12/1984 | Miniet | |
| 4,922,376 A | 5/1990 | Pommer et al. | |
| 4,964,948 A | 10/1990 | Reed | |
| 5,014,159 A | 5/1991 | Butt | |
| 5,072,520 A | 12/1991 | Nelson | |
| 5,127,837 A | 7/1992 | Shah et al. | |
| 5,129,573 A | 7/1992 | Duffey | |
| 5,161,983 A | 11/1992 | Ohno | |
| 5,208,068 A | 5/1993 | Davis et al. | |
| 5,237,203 A | 8/1993 | Massaron | |
| 5,246,880 A | 9/1993 | Reele et al. | |
| 5,286,680 A | 2/1994 | Cain | |
| 5,334,029 A | 8/1994 | Akkapeddi et al. | |
| 5,358,621 A | 10/1994 | Oyama | |
| 5,378,981 A | 1/1995 | Higgins, III | |
| 5,419,038 A | 5/1995 | Wang et al. | |
| 5,454,161 A | 10/1995 | Beilin et al. | |
| 5,479,319 A | 12/1995 | Werther et al. | |
| 5,509,019 A | 4/1996 | Yamamura | |
| 5,527,998 A | 6/1996 | Anderson et al. | |
| 5,562,462 A | 10/1996 | Matsuba et al. | |
| 5,659,181 A | 8/1997 | Bridenbaugh | |
| 5,674,595 A | 10/1997 | Busacco et al. | |
| 5,691,041 A | 11/1997 | Frankeny et al. | |
| 5,716,663 A | 2/1998 | Capote et al. | |
| 5,741,624 A | 4/1998 | Jeng et al. | |
| 5,746,608 A | 5/1998 | Taylor | |
| 5,761,801 A | 6/1998 | Gebhardt et al. | |
| 5,791,911 A | 8/1998 | Fasano et al. | |
| 5,802,711 A | 9/1998 | Card et al. | |
| 5,819,579 A | 10/1998 | Roberts | |
| 5,904,546 A | 5/1999 | Wood et al. | |
| 5,913,109 A | 6/1999 | Distefano et al. | |
| 5,925,931 A | 7/1999 | Yamamoto | |
| 5,933,558 A | 8/1999 | Sauvageau et al. | |
| 6,020,597 A | 2/2000 | Kwak | |
| 6,062,879 A | 5/2000 | Beaman et al. | |
| 6,080,932 A | 6/2000 | Smith et al. | |
| 6,118,426 A | 9/2000 | Albert | |
| 6,120,588 A | 9/2000 | Jacobson | |
| 6,137,687 A * | 10/2000 | Shirai et al. ................... 361/783 |
| 6,172,879 B1 | 1/2001 | Cilia et al. | |
| 6,177,921 B1 | 1/2001 | Comiskey | |
| 6,178,540 B1 | 1/2001 | Lo et al. | |
| 6,181,144 B1 | 1/2001 | Hembree et al. | |
| 6,200,143 B1 | 3/2001 | Haba et al. | |
| 6,207,259 B1 | 3/2001 | Iino et al. | |
| 6,225,692 B1 | 5/2001 | Hinds | |
| 6,247,938 B1 | 6/2001 | Rathburn | |
| 6,252,564 B1 | 6/2001 | Albert | |
| 6,255,126 B1 | 7/2001 | Mathieu et al. | |
| 6,263,566 B1 | 7/2001 | Hembree et al. | |
| 6,270,363 B1 | 8/2001 | Brofman et al. | |
| 6,312,971 B1 | 11/2001 | Amundson | |
| 6,313,528 B1 | 11/2001 | Solberg | |
| 6,320,256 B1 | 11/2001 | Ho | |
| 6,350,386 B1 | 2/2002 | Lin | |
| 6,359,790 B1 | 3/2002 | Meyer-Berg | |
| 6,413,790 B1 | 7/2002 | Duthaler | |
| 6,422,687 B1 | 7/2002 | Jacobson | |
| 6,437,452 B2 | 8/2002 | Lin | |
| 6,459,418 B1 | 10/2002 | Comiskey | |
| 6,461,183 B1 | 10/2002 | Ohkita | |
| 6,462,418 B2 | 10/2002 | Sakamoto et al. | |
| 6,477,286 B1 | 11/2002 | Ouchi | |
| 6,506,438 B2 | 1/2003 | Duthaler et al. | |
| 6,521,489 B2 | 2/2003 | Duthaler | |
| 6,545,291 B1 | 4/2003 | Amundson | |
| 6,574,114 B1 | 6/2003 | Brindle et al. | |
| 6,593,535 B2 | 7/2003 | Gailus | |
| 6,603,080 B2 | 8/2003 | Jensen | |
| 6,614,104 B2 | 9/2003 | Farnworth | |
| 6,626,526 B2 | 9/2003 | Ueki | |
| 6,639,578 B1 | 10/2003 | Comiskey | |
| 6,642,127 B2 | 11/2003 | Kumar et al. | |
| 6,652,075 B2 | 11/2003 | Jacobson | |
| 6,661,084 B1 | 12/2003 | Peterson et al. | |
| 6,662,442 B1 * | 12/2003 | Matsui et al. ................... 29/852 |
| 6,709,967 B2 | 3/2004 | Evers | |
| 6,744,126 B1 | 6/2004 | Chiang | |
| 6,750,473 B2 | 6/2004 | Amundson | |
| 6,750,551 B1 | 6/2004 | Frutschy et al. | |
| 6,758,691 B1 | 7/2004 | McHugh | |
| 6,773,302 B2 | 8/2004 | Gutierrez et al. | |
| 6,800,169 B2 | 10/2004 | Liu et al. | |
| 6,809,414 B1 | 10/2004 | Lin et al. | |
| 6,821,131 B2 | 11/2004 | Suzuki et al. | |
| 6,823,124 B1 | 11/2004 | Renn | |
| 6,825,829 B1 | 11/2004 | Albert | |
| 6,827,611 B1 | 12/2004 | Payne et al. | |
| 6,830,460 B1 | 12/2004 | Rathburn | |
| 6,840,777 B2 | 1/2005 | Sathe et al. | |
| 6,861,345 B2 | 3/2005 | Ball et al. | |
| 6,910,897 B2 | 6/2005 | Driscoll et al. | |
| 6,946,325 B2 | 9/2005 | Yean et al. | |
| 6,962,829 B2 * | 11/2005 | Glenn et al. ................... 29/835 |
| 6,965,168 B2 | 11/2005 | Langhorn | |
| 6,967,640 B2 | 11/2005 | Albert | |
| 6,971,902 B2 | 12/2005 | Taylor | |
| 6,987,661 B1 * | 1/2006 | Huemoeller et al. ......... 361/312 |
| 6,992,376 B2 | 1/2006 | Jaeck | |
| 7,009,413 B1 | 3/2006 | Alghouli | |
| 7,025,600 B2 | 4/2006 | Higashi | |
| 7,029,289 B2 | 4/2006 | Li | |
| 7,040,902 B2 | 5/2006 | Li | |
| 7,045,015 B2 | 5/2006 | Renn | |
| 7,064,412 B2 | 6/2006 | Geissinger et al. | |
| 7,095,090 B2 | 8/2006 | Nakajima et al. | |
| 7,101,210 B2 | 9/2006 | Lin | |
| 7,114,960 B2 | 10/2006 | Rathburn | |
| 7,118,391 B2 | 10/2006 | Minich et al. | |
| 7,121,837 B2 | 10/2006 | Sato et al. | |
| 7,121,839 B2 | 10/2006 | Rathburn | |
| 7,129,166 B2 | 10/2006 | Speakman | |
| 7,138,328 B2 | 11/2006 | Downey et al. | |
| 7,145,228 B2 | 12/2006 | Yean et al. | |
| 7,148,128 B2 | 12/2006 | Jacobson | |
| 7,154,175 B2 | 12/2006 | Shrivastava et al. | |
| 7,157,799 B2 | 1/2007 | Noquil et al. | |
| 7,217,996 B2 | 5/2007 | Cheng et al. | |
| 7,220,287 B1 | 5/2007 | Wyrzykowska et al. | |

(56) References Cited

U.S. PATENT DOCUMENTS

| | | |
|---|---|---|
| 7,229,293 B2 | 6/2007 | Sakurai et al. |
| 7,244,967 B2 | 7/2007 | Hundt et al. |
| 7,249,954 B2 | 7/2007 | Weiss |
| 7,301,105 B2 | 11/2007 | Vasoya |
| 7,321,168 B2 | 1/2008 | Tao |
| 7,326,064 B2 | 2/2008 | Rathburn |
| 7,327,006 B2 | 2/2008 | Svard et al. |
| 7,337,537 B1 | 3/2008 | Smetana, Jr. |
| 7,382,363 B2 | 6/2008 | Albert et al. |
| 7,402,515 B2 | 7/2008 | Arana et al. |
| 7,410,825 B2 | 8/2008 | Majumdar et al. |
| 7,411,304 B2 | 8/2008 | Kirby et al. |
| 7,417,299 B2 | 8/2008 | Hu |
| 7,417,314 B1 | 8/2008 | Lin et al. |
| 7,422,439 B2 | 9/2008 | Rathburn et al. |
| 7,423,219 B2 | 9/2008 | Kawaguchi et al. |
| 7,427,717 B2 | 9/2008 | Morimoto et al. |
| 7,432,600 B2 | 10/2008 | Klein et al. |
| 7,458,150 B2 | 12/2008 | Totokawa et al. |
| 7,459,393 B2 | 12/2008 | Farnworth et al. |
| 7,485,345 B2 | 2/2009 | Renn |
| 7,508,076 B2 | 3/2009 | Japp et al. |
| 7,527,502 B2 | 5/2009 | Li |
| 7,537,461 B2 | 5/2009 | Rathburn |
| 7,538,415 B1 | 5/2009 | Lin et al. |
| 7,548,430 B1 | 6/2009 | Huemoeller et al. |
| 7,563,645 B2 | 7/2009 | Jaeck |
| 7,595,454 B2 | 9/2009 | Kresge et al. |
| 7,619,309 B2 | 11/2009 | Drexl et al. |
| 7,621,761 B2 | 11/2009 | Mok et al. |
| 7,632,106 B2 | 12/2009 | Nakamura |
| 7,651,382 B2 | 1/2010 | Yasumura et al. |
| 7,658,163 B2 | 2/2010 | Renn |
| 7,674,671 B2 | 3/2010 | Renn |
| 7,726,984 B2 | 6/2010 | Bumb et al. |
| 7,748,110 B2 | 7/2010 | Asahi et al. |
| 7,800,916 B2 | 9/2010 | Blackwell et al. |
| 7,833,832 B2 | 11/2010 | Wood et al. |
| 7,897,503 B2 | 3/2011 | Foster et al. |
| 7,898,087 B2 | 3/2011 | Chainer |
| 7,999,369 B2 | 8/2011 | Malhan et al. |
| 8,072,058 B2 | 12/2011 | Kim et al. |
| 8,120,173 B2 | 2/2012 | Forman et al. |
| 8,148,643 B2 | 4/2012 | Hirose et al. |
| 8,154,119 B2 | 4/2012 | Yoon et al. |
| 8,158,503 B2 | 4/2012 | Abe |
| 8,159,824 B2 | 4/2012 | Cho et al. |
| 8,178,978 B2 | 5/2012 | McElrea et al. |
| 8,227,703 B2 | 7/2012 | Maruyama et al. |
| 8,232,632 B2 | 7/2012 | Rathburn |
| 8,278,141 B2 | 10/2012 | Chow et al. |
| 8,299,494 B2 | 10/2012 | Yilmaz et al. |
| 8,329,581 B2 | 12/2012 | Haba et al. |
| 8,344,516 B2 | 1/2013 | Chainer |
| 8,373,428 B2 | 2/2013 | Eldridge et al. |
| 8,421,151 B2 | 4/2013 | Yamashita |
| 8,525,346 B2 | 9/2013 | Rathburn |
| 8,536,714 B2 | 9/2013 | Sakaguchi |
| 8,610,265 B2 | 12/2013 | Rathburn |
| 8,618,649 B2 | 12/2013 | Rathburn |
| 8,758,067 B2 | 6/2014 | Rathburn |
| 8,789,272 B2 | 7/2014 | Rathburn |
| 8,803,539 B2 | 8/2014 | Rathburn |
| 8,829,671 B2 | 9/2014 | Rathburn |
| 2001/0012707 A1 | 8/2001 | Ho et al. |
| 2001/0016551 A1 | 8/2001 | Yushio et al. |
| 2002/0011639 A1 | 1/2002 | Carlson et al. |
| 2002/0027441 A1 | 3/2002 | Akram et al. |
| 2002/0062200 A1 | 5/2002 | Mori et al. |
| 2002/0079912 A1 | 6/2002 | Shahriari et al. |
| 2002/0088116 A1 | 7/2002 | Milkovich et al. |
| 2002/0098740 A1 | 7/2002 | Ooya |
| 2002/0105080 A1 | 8/2002 | Speakman |
| 2002/0105087 A1 | 8/2002 | Forbes et al. |
| 2002/0160103 A1 | 10/2002 | Fukunaga et al. |
| 2003/0003779 A1 | 1/2003 | Rathburn |
| 2003/0114029 A1 | 6/2003 | Lee et al. |
| 2003/0117161 A1 | 6/2003 | Burns |
| 2003/0156400 A1 | 8/2003 | Dibene et al. |
| 2003/0162418 A1 | 8/2003 | Yamada |
| 2003/0188890 A1 | 10/2003 | Bhatt et al. |
| 2003/0189083 A1 | 10/2003 | Olsen |
| 2004/0016995 A1 | 1/2004 | Kuo et al. |
| 2004/0029411 A1 | 2/2004 | Rathburn |
| 2004/0048523 A1 | 3/2004 | Huang et al. |
| 2004/0054031 A1 | 3/2004 | Jacobson |
| 2004/0070042 A1 | 4/2004 | Lee et al. |
| 2004/0077190 A1 | 4/2004 | Huang et al. |
| 2004/0174180 A1 | 9/2004 | Fukushima et al. |
| 2004/0183557 A1 | 9/2004 | Akram |
| 2004/0184219 A1 | 9/2004 | Otsuka et al. |
| 2004/0217473 A1 | 11/2004 | Shen |
| 2004/0243348 A1 | 12/2004 | Minatani |
| 2005/0048680 A1 | 3/2005 | Matsunami |
| 2005/0100294 A1 | 5/2005 | Nguyen et al. |
| 2005/0101164 A1 | 5/2005 | Rathburn |
| 2005/0164527 A1 | 7/2005 | Radza et al. |
| 2006/0001152 A1 | 1/2006 | Hu |
| 2006/0006534 A1 | 1/2006 | Yean et al. |
| 2006/0012966 A1 | 1/2006 | Chakravorty |
| 2006/0024924 A1 | 2/2006 | Haji et al. |
| 2006/0044357 A1 | 3/2006 | Anderson |
| 2006/0087064 A1 | 4/2006 | Daniel et al. |
| 2006/0149491 A1 | 7/2006 | Flach et al. |
| 2006/0157103 A1 | 7/2006 | Sheats et al. |
| 2006/0160379 A1 | 7/2006 | Rathburn |
| 2006/0186906 A1 | 8/2006 | Bottoms et al. |
| 2006/0208230 A1 | 9/2006 | Cho et al. |
| 2006/0258912 A1 | 11/2006 | Belson et al. |
| 2006/0261827 A1 | 11/2006 | Cooper et al. |
| 2007/0021002 A1 | 1/2007 | Laurx et al. |
| 2007/0145981 A1 | 6/2007 | Tomita et al. |
| 2007/0148822 A1 | 6/2007 | Haba et al. |
| 2007/0170595 A1 | 7/2007 | Sinha |
| 2007/0221404 A1 | 9/2007 | Das et al. |
| 2007/0224735 A1 | 9/2007 | Karashima et al. |
| 2007/0232059 A1 | 10/2007 | Abe |
| 2007/0259539 A1 | 11/2007 | Brown et al. |
| 2007/0269999 A1 | 11/2007 | Di Stefano |
| 2007/0273394 A1 | 11/2007 | Tanner et al. |
| 2007/0289127 A1 | 12/2007 | Hurwitz et al. |
| 2007/0296090 A1 | 12/2007 | Hembree |
| 2008/0008822 A1 | 1/2008 | Kowalski |
| 2008/0020566 A1 | 1/2008 | Egitto et al. |
| 2008/0041822 A1 | 2/2008 | Wang |
| 2008/0057753 A1 | 3/2008 | Rathburn et al. |
| 2008/0060838 A1 | 3/2008 | Chen et al. |
| 2008/0073110 A1 | 3/2008 | Shioga et al. |
| 2008/0093115 A1 | 4/2008 | Lee |
| 2008/0143358 A1 | 6/2008 | Breinlinger |
| 2008/0143367 A1 | 6/2008 | Chabineau-Lovgren |
| 2008/0156856 A1 | 7/2008 | Barausky et al. |
| 2008/0157361 A1 | 7/2008 | Wood et al. |
| 2008/0182436 A1 | 7/2008 | Rathburn |
| 2008/0185180 A1 | 8/2008 | Cheng et al. |
| 2008/0197867 A1 | 8/2008 | Wokhlu et al. |
| 2008/0220584 A1 | 9/2008 | Kim et al. |
| 2008/0241997 A1 | 10/2008 | Sunohara et al. |
| 2008/0246136 A1 | 10/2008 | Haba et al. |
| 2008/0248596 A1 | 10/2008 | Das et al. |
| 2008/0250363 A1 | 10/2008 | Goto et al. |
| 2008/0265919 A1 | 10/2008 | Izadian |
| 2008/0290885 A1 | 11/2008 | Matsunami |
| 2008/0309349 A1 | 12/2008 | Sutono |
| 2009/0246136 A1 | 2/2009 | Beer et al. |
| 2009/0058444 A1 | 3/2009 | McIntyre |
| 2009/0061089 A1 | 3/2009 | King |
| 2009/0065918 A1 | 3/2009 | Murphy |
| 2009/0127698 A1 | 5/2009 | Rathburn |
| 2009/0133906 A1 | 5/2009 | Baek |
| 2009/0224404 A1 | 9/2009 | Wood et al. |
| 2009/0241332 A1 | 10/2009 | Lauffer et al. |
| 2009/0267628 A1 | 10/2009 | Takase |
| 2009/0321915 A1 | 12/2009 | Hu et al. |

(56) References Cited

U.S. PATENT DOCUMENTS

| | | |
|---|---|---|
| 2010/0022105 A1 | 1/2010 | Di Stefano |
| 2010/0133680 A1 | 6/2010 | Kang et al. |
| 2010/0213960 A1 | 8/2010 | Mok et al. |
| 2011/0101540 A1 | 5/2011 | Chainer |
| 2012/0017437 A1 | 1/2012 | Das et al. |
| 2012/0043119 A1 | 2/2012 | Rathburn |
| 2012/0043130 A1 | 2/2012 | Rathburn |
| 2012/0043667 A1 | 2/2012 | Rathburn |
| 2012/0049342 A1 | 3/2012 | Rathburn |
| 2012/0049877 A1 | 3/2012 | Rathburn |
| 2012/0051016 A1 | 3/2012 | Rathburn |
| 2012/0055701 A1 | 3/2012 | Rathburn |
| 2012/0055702 A1 | 3/2012 | Rathburn |
| 2012/0056332 A1 | 3/2012 | Rathburn |
| 2012/0056640 A1 | 3/2012 | Rathburn |
| 2012/0058653 A1 | 3/2012 | Rathburn |
| 2012/0061846 A1 | 3/2012 | Rathburn |
| 2012/0061851 A1 | 3/2012 | Rathburn |
| 2012/0062270 A1 | 3/2012 | Rathburn |
| 2012/0068727 A1 | 3/2012 | Rathburn |
| 2012/0161317 A1 | 6/2012 | Rathburn |
| 2012/0164888 A1 | 6/2012 | Rathburn |
| 2012/0168948 A1 | 7/2012 | Rathburn |
| 2012/0171907 A1 | 7/2012 | Rathburn |
| 2012/0182035 A1 | 7/2012 | Rathburn |
| 2012/0199985 A1 | 8/2012 | Rathburn |
| 2012/0202364 A1 | 8/2012 | Rathburn |
| 2012/0244728 A1 | 9/2012 | Rathburn |
| 2012/0252164 A1 | 10/2012 | Nakao et al. |
| 2012/0257343 A1 | 10/2012 | Das et al. |
| 2012/0268155 A1 | 10/2012 | Rathburn |
| 2013/0078860 A1 | 3/2013 | Rathburn |
| 2013/0105984 A1 | 5/2013 | Rathburn |
| 2013/0203273 A1 | 8/2013 | Rathburn |
| 2013/0206468 A1 | 8/2013 | Rathburn |
| 2013/0210276 A1 | 8/2013 | Rathburn |
| 2013/0223034 A1 | 8/2013 | Rathburn |
| 2013/0244490 A1 | 9/2013 | Rathburn |
| 2013/0330942 A1 | 12/2013 | Rathburn |
| 2014/0043782 A1 | 2/2014 | Rathburn |
| 2014/0080258 A1 | 3/2014 | Rathburn |
| 2014/0192498 A1 | 7/2014 | Rathburn |
| 2014/0220797 A1 | 8/2014 | Rathburn |
| 2014/0225255 A1 | 8/2014 | Rathburn |

FOREIGN PATENT DOCUMENTS

| | | |
|---|---|---|
| WO | WO 2006/039277 | 4/2006 |
| WO | WO 2006/124597 | 11/2006 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO-2012/061008 | 5/2012 |
| WO | WO-2012/074963 | 6/2012 |
| WO | WO-2012/074969 | 6/2012 |
| WO | WO-2012/078493 | 6/2012 |
| WO | WO 2012/122142 | 9/2012 |
| WO | WO 2012/125331 | 9/2012 |
| WO | WO 2013/036565 | 3/2013 |
| WO | WO-2014/011226 | 1/2014 |
| WO | WO-2014/011228 | 1/2014 |
| WO | WO-2014/011232 | 1/2014 |

OTHER PUBLICATIONS

Amendment and Response filed Feb. 26, 2014 in co-pending U.S. Appl. No. 13/266,573, now published as US Patent Application Publication No. 2012/0061846.

Amendment and Response filed Jan. 3, 2014 in co-pending U.S. Appl. No. 13/266,907, now published as US Patent Application Publication No. US 2012/0268155.

Supplemental Amendment and Response filed Jan. 29, 2014 in co-pending U.S. Appl. No. 13/266,907, now published as US Patent Application Publication No. US 2012/0268155.

Office Action mailed Jan. 3, 2014 in co-pending U.S. Appl. No. 13/318,038, now published as US Patent Application Publication No. US 2012/0062270.

Office Action mailed Feb. 14, 2014 in co-pending U.S. Appl. No. 13/318,171, now published as US Patent Application Publication No. US 2012/0049877.

Amendment and Response filed Feb. 26, 2014 in co-pending U.S. Appl. No. 13/318,171, now published as US Patent Application Publication No. US 2012/0049877.

Response to Advisory Action filed Dec. 6, 2013 in co-pending U.S. Appl. No. 13/318,200, now published as US Patent Application Publication No. US 2012/0056332.

Request for Continued Examination filed Feb. 11, 2014 in co-pending U.S. Appl. No. 13/318,200, now published as US Patent Application Publication No. US 2012/0056332.

Final Office Action mailed Jan. 8, 2014 in co-pending U.S. Appl. No. 13/320,285, now published as US Patent Application Publication No. US 2012/0055702.

Amendment and Response to Final Office filed Feb. 18, 2014 in co-pending U.S. Appl. No. 13/320,285, now published as US Patent Application Publication No. US 2012/0055702.

Advisory Action mailed Feb. 26, 2014 in co-pending U.S. Appl. No. 13/320,285, now published as US Patent Application Publication No. US 2012/0055702.

Office Action mailed Jan. 17, 2014 in co-pending U.S. Appl. No. 13/319,120 now published as US Patent Application Publication No. US 2012/0061851.

Office Action mailed Dec. 26, 2013 in co-pending U.S. Appl. No. 13/319,145, now published as US Patent Application Publication No. 2012/0049342.

Restriction Requirement mailed Jan. 30, 2014 in co-pending U.S. Appl. No. 13/319,158, now published as US Patent Application Publication No. 2012/0051016.

Response to Restriction Requirement filed Feb. 6, 2014 in co-pending U.S. Appl. No. 13/319,158, now published as US Patent Application Publication No. 2012/0051016.

Office Action mailed Feb. 27, 2014 in co-pending U.S. Appl. No. 13/319,203, now published as US Patent Application Publication No. 2012/0056640.

Restriction Requirement mailed Feb. 7, 2014 in co-pending U.S. Appl. No. 13/575,368, now published as US Patent Application Publication No. 2013/0203273.

Response to Restriction Requirement filed Feb. 19, 2014 in co-pending U.S. Appl. No. 13/575,368, now published as US Patent Application Publication No. 2013/0203273.

Office Action mailed Mar. 4, 2014 in co-pending U.S. Appl. No. 13/575,368, now published as US Patent Application Publication No. 2013/0203273.

Notice of Allowance and Fee(s) Due mailed Feb. 26, 2014 in co-pending U.S. Appl. NO. 13/412,870, now published as US Patent Application Publication No. US 2012/0171907.

Final Office Action mailed Feb. 14, 2014 in co-pending U.S. Appl. No. 13/413,724, now published as US Patent Application Publication No. US 2012/0168948.

(56) References Cited

OTHER PUBLICATIONS

Amendment and Response to Final Office filed Feb. 26, 2014 in co-pending U.S. Appl. No. 13/413,724, now published as US Patent Application Publication No. US 2012/0168948.
Amendment and Response to Final Office filed Dec. 30, 2013 in co-pending U.S. Appl. No. 13/969,953, now published as US Patent Application Publication No. US 2013/0330942.
Notice of Allowance and Fee(s) Due mailed Jan. 22, 2014 in co-pending U.S. Appl. No. 13/969,953, now published as US Patent Application Publication No. US 2013/0330942.
Co-pending U.S. Appl. No. 14/238,638 titled Direct Metalization of Electrical Circuit Structure, filed Feb. 12, 2014.
Notification of Transmittal of the International Search Report and the Written Opinion of the International Searching Authority mailed Feb. 8, 2012 in International Application No. PCT/US2011/0.
Notification of Transmittal of the International Search Report and the Written Opinion of the International Searching Authority mailed Mar. 26, 2012 in International Application No. PCT/US2011/062313.
Co-pending U.S. Appl. No. 13/410,914, titled Metalized Pad to Electrical Contact Interface, filed Mar. 2, 2012.
Co-pending U.S. Appl. No. 13/410,943, titled Area Array Semiconductor Device Package Interconnect Structure With Optional Package-To-Package or Flexible Circuit to Package Connection, filed Mar. 2, 2012.
Co-pending U.S. Appl. No. 13/412,870, titled Selective Metalization of Electrical Connector or Socket Housing, filed Mar. 6, 2012.
Co-pending U.S. Appl. No. 13/413,032, titled Bumped Semiconductor Wafer or Die Level Electrical Interconnect, filed Mar. 6, 2012.
Co-pending U.S. Appl. No. 13/413,724, titled Copper Pillar Full Metal Via Electrical Circuit Structure, filed Mar. 7, 2012.
Co-pending U.S. Appl. No. 13/418,853, titled High Performance Surface Mount Electrical Interconnect With External Biased Normal Force Loading, filed Mar. 13, 2012.
Restriction Requirement mailed Mar. 1, 2013 in co-pending U.S. Appl. No. 13/318,200, now published as US Patent Application Publication No. US 2012/0056332.
Response to Restriction Requirement filed Mar. 7, 3013 in co-pending U.S. Appl. No. 13/318,200, now published as US Patent Application Publication No. US 2012/0056332.
Amendment and Response filed Mar. 4, 2013 in co-pending U.S. Appl. No. 13/318,263, now published as US Patent Application Publication No. US 2012/0043667.
Co-pending U.S. Appl. No. 13/879,783 titled High Performance Electrical Circuit Structure, filed Apr. 16, 2013.
Co-pending U.S. Appl. No. 13/879,883 titled High Performance Surface Mount Electrical Interconnect, filed Apr. 17, 2013.
Co-pending U.S. Appl. No. 13/880,231 titled Electrical Interconnect IC Device Socket, filed Apr. 18, 2013.
Co-pending U.S. Appl. No. 13/880,461 titled Electrical Interconnect IC Device Socket, filed Apr. 19, 2013.
Liu, et al, "All-Polymer Capacitor Fabricated with Inkjet Printing Technique," Solid-State Electronics, vol. 47, pp. 1543-1548 (2003).
Notification of Transmittal of the International Search Report and the Written Opinion of the International Searching Authority mailed Jun. 7, 2013 in International Application No. PCT/US2013/030856.
Notification of Transmittal of the International Search Report and the Written Opinion of the International Searching Authority mailed Jun. 19, 2013 in International Application No. PCT/US2013/030981.
Notification of Transmittal of the International Search Report and the Written Opinion of the International Searching Authority mailed Jun. 3, 2013 in International Application No. PCT/US2013/031395.
Restriction Requirement mailed Jun. 13, 2013 in co-pending U.S. Appl. No. 13/266,486, now published as US Patent Application Publication No. US 2012/0055701.
Office Communication mailed May 30, 2013 in co-pending U.S. Appl. No. 13/318,200, now published as US Patent Application Publication No. US 2012/0056332.

Office Action mailed May 30, 2013 in co-pending U.S. Appl. No. 13/318,200, now published as US Patent Application Publication No. US 2012/0056332.
Amendment and Response filed Jul. 1, 2013 in co-pending U.S. Appl. No. 13/318,200, now published as US Patent Application Publication No. US 2012/0056332.
Examiner-Initiated Interview Summary mailed Mar. 14, 2013 in co-pending U.S. Appl. No. 13/319,228, now published as US Patent Application Publication No. US 2012/0058653.
Office Action mailed Apr. 30, 2013 in co-pending U.S. Appl. No. 13/413,724, now published as US Patent Application Publication No. US 2012/0168948.
Amendment and Response filed May 7, 2013 in co-pending U.S. Appl. No. 13/413,724, now published as US Patent Application Publication No. US 2012/0168948.
Notice of Non-Compliant Amendment mailed May 16, 2013 in co-pending U.S. Appl. No. 13/413,724, now published as US Patent Application Publication No. US 2012/0168948.
Revised Amendment and Response filed May 17, 2013 in co-pending U.S. Appl. No. 13/413,724, now published as US Patent Application Publication No. US 2012/0168948.
Office Action mailed May 9, 2013 in co-pending U.S. Appl. No. 13/448,914, now published as US Patent Application Publication No. US 2012/0202364.
Amendment and Responde filed May 20, 2013 in co-pending U.S. Appl. No. 13/448,914, now published as US Patent Application Publication No. US 2012/0202364.
Notification of Transmittal of the International Search Report and the Written Opinion of the International Searching Authority mailed Nov. 29, 2012 in International Application No. PCT/US2012/053848.
Tarzwell, Robert, "A Real Printed Electronic Replacement for PCB Fabrication," PCB007 Magazine, May 19, 2009.
Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Restriction Requirement mailed Nov. 23, 2012 in co-pending U.S. Appl. No. 13/318,263, now published as US Patent Application Publication No. US 2012/0043667.
Co-pending U.S. Appl. No. 13/643,436 titled Semiconductor Device Package Adapter, filed Oct. 25, 2012.
Co-pending U.S. Appl. No. 13/700,639 titled Electrical Connector Insulator Housing, filed Nov. 28, 2012.
Office Action mailed Oct. 30, 2013 in co-pending U.S. Appl. No. 13/266,486, now published as US Patent Application Publication No. US 2012/0055701.
Amendment and Response filed Nov. 6, 2013 in co-pending U.S. Appl. No. 13/266,486, now published as US Patent Application Publication No. US 2012/0055701.
Notice of Non-Compliant Amended mailed Nov. 15, 2013 in co-pending U.S. Appl. No. 13/266,486, now published as US Patent Application Publication No. US 2012/0055701.
Response and Examiner's Interview Summary filed Nov. 20, 2013 in co-pending U.S. Appl. No. 13/266,486, now published as US Patent Application Publication No. US 2012/0055701.
Response to Restriction Requirement filed Oct. 7, 2013 in co-pending U.S. Appl. No. 13/266,573, now published as US Patent Application Publication No. 2012/0061846.
Office Action mailed Nov. 22, 2013 in co-pending U.S. Appl. No. 13/266,907, now published as US Patent Application Publication No. US 2012/0268155.
Restriction Requirement mailed Dec. 9, 2013 in co-pending U.S. Appl. No. 13/318,171, now published as US Patent Application Publication No. US 2012/0049877.

(56) References Cited

OTHER PUBLICATIONS

Response to Restriction Requirement filed Dec. 17, 2013 in co-pending U.S. Appl. No. 13/318,171, now published as US Patent Application Publication No. US 2012/0049877.
Final Office Action mailed Nov. 6, 2013 in co-pending U.S. Appl. No. 13/318,200, now published as US Patent Application Publication No. US 2012/0056332.
Amendment and Response to Final Office Action filed Nov. 26, 2013 in co-pending U.S. Appl. No. 13/318,200, now published as US Patent Application Publication No. US 2012/0056332.
Advisory Action mailed Dec. 6, 2013 in co-pending U.S. Appl. No. 13/318,200, now published as US Patent Application Publication No. US 2012/0056332.
Notice of Allowance mailed Oct. 28, 2013 in co-pending U.S. Appl. No. 13/318,263, now published as US Patent Application Publication No. US 2012/0043667.
Office Action mailed Sep. 10, 2013 in co-pending U.S. Appl. No. 13/320,285, now published as US Patent Application Publication No. US 2012/0055702.
Amendment and Response filed Oct. 2, 2013 in co-pending U.S. Appl. No. 13/320,285, now published as US Patent Application Publication No. US 2012/0055702.
Response to Restriction Requirement filed Oct. 8, 2013 in co-pending U.S. Appl. No. 13/319,120 now published as US Patent Application Publication No. US 2012/0061851.
Notice of Non-Compliant Amendment mailed Oct. 15, 2013 in co-pending U.S. Appl. No. 13/319,120 now published as US Patent Application Publication No. US 2012/0061851.
Response to Restriction Requirement filed Oct. 18, 2013 in co-pending U.S. Appl. No. 13/319,120 now published as US Patent Application Publication No. US 2012/0061851.
Office Action mailed Dec. 16, 2013 in co-pending U.S. Appl. No. 13/410,914, now published as US Patent Application Publication No. US 2012/0164888.
Office Action mailed Nov. 7, 2013 in co-pending U.S. Appl. No. 13/412,870, now published as US Patent Application Publication No. US 2012/0171907.
Amendment and Response filed Dec. 10, 2013 in co-pending U.S. Appl. No. 13/412,870, now published as US Patent Application Publication No. US 2012/0171907.
Amendment and Response filed Nov. 20, 2013 in co-pending U.S. Appl. No. 13/413,724, now published as US Patent Application Publication No. US 2012/0168948.
Notice of Allowance and Fee(s) Due mailed Dec. 6, 2013 in co-pending U.S. Appl. No. 14/058,863.
Office Action mailed Oct. 7, 2013 in co-pending U.S. Appl. No. 13/969,953, now published as US Patent Application Publication No. US 2013/0330942.
Amendment and Response and Terminal Disclaimer filed Nov. 20, 2013 in co-pending U.S. Appl. No. 13/969,953, now published as US Patent Application Publication No. US 2013/0330942.
Final Office Action mailed Dec. 20, 2013 in co-pending U.S. Appl. No. 13/969,953, now published as US Patent Application Publication No. US 2013/0330942.
Co-pending U.S. Appl. No. 14/058,863 titled Compliant Core Peripheral Lead Semiconductor Socket, filed Oct. 21, 2013.
Co-pending U.S. Appl. No. 14/086,029 titled Compliant Printed Circuit Semiconductor Package, filed Nov. 21, 2013.
Notification of Transmittal of the International Search Report and the Written Opinion of the International Searching Authority issued Jul. 30, 2010 in International Application No. PCT/US2010/036043.
Notification of Transmittal of the International Search Report and the Written Opinion of the International Searching Authority issued Jul. 21, 2010 in International Application No. PCT/US2010/036047.
Notification of Transmittal of the International Search Report and the Written Opinion of the International Searching Authority issued Jul. 28, 2010 in International Application No. PCT/US2010/036363.
Notification of Transmittal of the International Search Report and the Written Opinion of the International Searching Authority issued Jul. 28, 2010 in International Application No. PCT/US2010/036377.
Notification of Transmittal of the International Search Report and the Written Opinion of the International Searching Authority issued Jul. 30, 2010 in International Application No. PCT/US2010/036388.
Notification of Transmittal of the International Search Report and the Written Opinion of the International Searching Authority issued Jul. 27, 2010 in International Application No. PCT/US2010/036397.
Notification of Transmittal of the International Search Report and the Written Opinion of the International Searching Authority issued Jul. 30, 2010 in International Application No. PCT/US2010/036055.
Notification of Transmittal of the International Search Report and the Written Opinion of the International Searching Authority issued Aug. 4, 2010 in International Application No. PCT/US2010/036288.
Notification of Transmittal of the International Search Report and the Written Opinion of the International Searching Authority issued Aug. 4, 2010 in International Application No. PCT/US2010/036285.
Notification of Transmittal of the International Search Report and the Written Opinion of the International Searching Authority issued Jul. 30, 2010 in International Application No. PCT/US2010/036282.
Notification of Transmittal of the International Search Report and the Written Opinion of the International Searching Authority issued Jul. 30, 2010 in International Application No. PCT/US2010/036295.
Notification of Transmittal of the International Search Report and the Written Opinion of the International Searching Authority issued Jul. 30, 2010 in International Application No. PCT/US2010/036313.
Notification of Transmittal of the International Search Report and the Written Opinion of the International Searching Authority issued Aug. 3, 2010 in International Application No. PCT/US2010/037619.
Notification of Transmittal of the International Search Report and the Written Opinion of the International Searching Authority issued Sep. 7, 2010 in International Application No. PCT/US2010/038600.
Notification of Transmittal of the International Search Report and the Written Opinion of the International Searching Authority issued Aug. 18, 2010 in International Application No. PCT/US2010/038606.
Notification of Transmittal of the International Search Report and the Written Opinion of the International Searching Authority issued Sep. 1, 2010 in International Application No. PCT/US2010/040188.
Notification of Transmittal of the International Search Report and the Written Opinion of the International Searching Authority issued Aug. 20, 2010 in International Application No. PCT/US2010/040197.
Notification of Transmittal of the International Search Report and the Written Opinion of the International Searching Authority issued Apr. 14, 2011 in International Application No. PCT/US2011/023138.
Notification of Transmittal of the International Search Report and the Written Opinion of the International Searching Authority issued Aug. 17, 2011 in International Application No. PCT/US2011/033726.
Notification of Transmittal of the International Search Report and the Written Opinion of the International Searching Authority issued Sep. 27, 2011 in International Application No. PCT/US2011/038845.
Co-pending U.S. Appl. No. 13/266,486 titled High Performance Surface Mount Electrical Interconnect, filed Oct. 27, 2011.
Co-pending U.S. Appl. No. 13/266,522, titled Compliant Wafer Level Probe Assembly, filed Oct. 27, 2011.
Co-pending U.S. Appl. No. 13/266,573, titled Compliant Printed Circuit Area Array Semiconductor Device Package, filed Oct. 27, 2011.
Co-pending U.S. Appl. No. 13/266,907, titled Compliant Printed Circuit Socket Diagnostic Tool, filed Oct. 28, 2011.
Co-pending U.S. Appl. No. 13/318,038, titled Compliant Printed Circuit Wafer Probe Diagnostic Tool, filed Oct. 28, 2011.
Co-pending U.S. Appl. No. 13/318,171, titled Compliant Printed Circuit Peripheral Lead Semiconductor Test Socket, filed Oct. 31, 2011.
Co-pending U.S. Appl. No. 13/318,200, titled Compliant Printed Circuit Wafer Level Semiconductor Package, filed Oct. 31, 2011.
Co-pending U.S. Appl. No. 13/318,263, titled Compliant Printed Circuit Semiconductor Package, filed Oct. 31, 2011.
Co-pending U.S. Appl. No. 13/320,285, titled Compliant Printed Flexible Circuit, filed Nov. 14, 2011.
Co-pending U.S. Appl. No. 13/318,369, titled Composite Polymer-Metal Electrical Contacts, filed Nov. 1, 2011.
Co-pending U.S. Appl. No. 13/318,382, titled Resilient Conductive Electrical Interconnect, filed Nov. 1, 2011.

(56) References Cited

OTHER PUBLICATIONS

Co-pending U.S. Appl. No. 13/319,120, titled Simulated Wirebond Semiconductive Package, filed Nov. 7, 2011.
Co-pending U.S. Appl. No. 13/319,145, titled Semiconductor Die Terminal, filed Nov. 7, 2011.
Co-pending U.S. Appl. No. 13/319,158, titled Semiconductor Socket, filed Nov. 7, 2011.
Co-pending U.S. Appl. No. 13/319,203, titled Compliant Printed Circuit Semiconductor Tester Interface, filed Nov. 7, 2011.
Co-pending U.S. Appl. No. 13/319,228, titled Singulated Semiconductor Device Separable Electrical Interconnect, filed Nov. 7, 2011.
Response to Restriction Requirement filed Jul. 15, 2013 in co-pending U.S. Appl. No. 13/266,486, now published as U.S. Patent Application Publication No. US 2012/0055701.
Restriction Requirement mailed Sep. 25, 2013 in co-pending U.S. Appl. No. 13/266,486, now published as US Patent Application Publication No. US 2012/0055701.
Response to Restriction Requirement filed Oct. 2, 2013 in co-pending U.S. Appl. No. 13/266,486, now published as US Patent Application Publication No. US 2012/0055701.
Office Action mailed Jul. 10, 2013 in co-pending U.S. Appl. No. 13/318,263, now published as US Patent Application Publication No. US 2012/0043667.
Amendment and Response filed Sep. 24, 2013 in co-pending U.S. Appl. No. 13/318,263, now published as US Patent Application Publication No. US 2012/0043667.
Notice of Allowance and Fee(s) Due mailed Jul. 17, 2013 in co-pending U.S. Appl. No. 13/448,914, now published as US Patent Application Publication No. US 2012/0202364.
Restriction Requirement mailed Sep. 9, 2013 in co-pending U.S. Appl. No. 13/410,914, now published as US Patent Application Publication No. US 2012/0164888.
Response to Restriction Requirement and Amendment to the Claims filed Sep. 25, 2013 in co-pending U.S. Appl. No. 13/410,914, now published as US Patent Application Publication No. US 2012/0164888.
Office Action mailed Sep. 16, 2013 in co-pending U.S. Appl. No. 13/413,724, now published as US Patent Application Publication No. US 2012/0168948.
Restriction Requirement mailed Sep. 26, 2013 in co-pending U.S. Appl. No. 13/319,120 now published as US Patent Application Publication No. US 2012/0061851.
Notice of Allowance and Fee(s) Due mailed Oct. 2, 2013 in co-pending U.S. Appl. No. 13/448,865, now published as US Patent Application Publication No. US 2012/0199985.
Restriction Requirement mailed Oct. 1, 2013 in co-pending U.S. Appl. No. 13/266,573, now published as US Patent Application Publication No. 2012/0061846.
Restriction Requirement mailed Oct. 1, 2013 in co-pending U.S. Appl. No. 13/319,145, now published as US Patent Application Publication No. 2012/0049342.
Co-pending U.S. Appl. No. 13/969,953 titled Compliant Conductive Nano-Particle Electrical Interconnect, filed Aug. 19, 2013.
Co-pending U.S. Appl. No. 13/575,368, titled High Speed Backplane Connector, filed Jul. 26, 2012.
Notification of Transmittal of the International Search Report and the Written Opinion of the International Searching Authority mailed Apr. 5, 2012 in International Application No. PCT/US2011/062321.
Notification of Transmittal of the International Search Report and the Written Opinion of the International Searching Authority mailed Mar. 29, 2012 in International Application No. PCT/US2011/063247.
Notification of Transmittal of the International Search Report and the Written Opinion of the International Searching Authority mailed Jun. 20, 2012 in International Application No. PCT/US2012/027813.
Notification of Transmittal of the International Search Report and the Written Opinion of the International Searching Authority mailed Jun. 19, 2012 in International Application No. PCT/US2012/027823.
Co-pending U.S. Appl. No. 13/448,865, titled Compliant Conductive Nano-Particle Electrical Interconnect, filed Apr. 17, 2012.
Co-pending U.S. Appl. No. 13/448,914, titled Compliant Core Peripheral Lead Semiconductor Test Socket, filed Apr. 17, 2012.
Amendment and Response and Terminal Disclaimer filed Apr. 2, 2014 in co-pending U.S. Appl. No. 13/318,038, now published as US Patent Application Publication No. US 2012/0062270.
Terminal Disclaimer Review Decision mailed Apr. 2, 2014 in co-pending U.S. Appl. No. 13/318,038, now published as US Patent Application Publication No. US 2012/0062270.
Notice of Allowance and Fee(s) Due mailed Mar. 14, 2014 in co-pending U.S. Appl. No. 13/318,171, now published as US Patent Application Publication No. US 2012/0049877.
RCE filed Mar. 10, 2014 in co-pending U.S. Appl. No. 13/320,285, now published as US Patent Application Publication No. US 2012/0055702.
Amendment and Response filed Apr. 16, 2014 in co-pending U.S. Appl. No. 13/319,120 now published as US Patent Application Publication No. US 2012/0061851.
Restriction Requirement mailed Apr. 23, 2014 in co-pending U.S. Appl. No. 13/319,228, now published as US Patent Application Publication No. US 2012/0058653.
Office Action mailed Apr. 24, 2014 in co-pending U.S. Appl. No. 13/700,639, now published as US Patent Application Publication No. 2013/0078860.
Amendment and Response filed Mar. 17, 2014 in co-pending U.S. Appl. No. 13/410,914, now published as US Patent Application Publication No. US 2012/0164888.
Advisory Action mailed Mar. 28, 2014 in co-pending U.S. Appl. No. 13/413,724, now published as US Patent Application Publication No. US 2012/0168948.
Second Amendment and Response filed Apr. 14, 2014 in co-pending U.S. Appl. No. 13/413,724, now published as US Patent Application Publication No. US 2012/0168948.
Restriction Requirement mailed Apr. 10, 2014 in co-pending U.S. Appl. No. 13/418,853, now published as US Patent Application Publication No. US 2012/0244728.
Office Action mailed Mar. 20, 2014 in co-pending U.S. Appl. No. 14/058,863, now published as US Patent Application Publication No. 2014/0043782.
Office Action mailed Mar. 27, 2014 in co-pending U.S. Appl. No. 14/058,863, now published as US Patent Application Publication No. 2014/0043782.
Response and Terminal Disclaimer filed Apr. 2, 2014 in co-pending U.S. Appl. No. 14/058,863, now published as US Patent Application Publication No. 2014/0043782.
Notice of Allowance and Fee(s) Due mailed Apr. 17, 2014 in co-pending U.S. Appl No. 14/058,863, now published as US Patent Application Publication No. 2014/0043782.
Co-pending U.S. Appl. No. 14/254,038 titled High Performance Electrical Connector With Translated Insulator Contact Positioning, filed Apr. 16, 2014.
Print—Definition of Print by the Free Dictionary, http://www.thefreedictionary.com/print, Aug. 13, 2014.
Amendment and Response Under Rule 1.116 filed Jul. 10, 2014 in co-pending U.S. Appl. No. 13/266,486, now published as US Patent Application Publication No. US 2012/0055701.
Advisory Action mailed Jul. 21, 2014 in co-pending U.S. Appl. No. 13/266,486, now published as US Patent Application Publication No. US 2012/0055701.
Request for Continued Examination filed Jul. 31, 2014 in co-pending U.S. Appl. No. 13/266,486, now published as US Patent Application Publication No. US 2012/0055701.
Office Action mailed Jul. 3, 2014 in co-pending U.S. Appl. No. 13/266,573, now published as US Patent Application Publication No. 2012/0061846.
Amendment and Response Under Rule 1.116 mailed Jul. 10, 2014 in co-pending U.S. Appl. No. 13/266,907, now published as US Patent Application Publication No. US 2012/0268155.
Advisory Action mailed Jul. 25, 2014 in co-pending U.S. Appl. No. 13/266,907, now published as US Patent Application Publication No. US 2012/0268155.
Advisory Action mailed Aug. 8, 2014 in co-pending U.S. Appl. No. 13/266,907, now published as US Patent Application Publication No. US 2012/0268155.

(56) References Cited

OTHER PUBLICATIONS

Amendment and Response to Final Office Action and RCE filed Aug. 26, 2014 in co-pending U.S. Appl. No. 13/266,907, now published as US Patent Application Publication No. US 2012/0268155.

Final Office Action mailed Aug. 1, 2014 in co-pending U.S. Appl. No. 13/318,038, now published as US Patent Application Publication No. US 2012/0062270.

Office Action mailed Jul. 29, 2014 in co-pending U.S. Appl. No. 13/320,285, now published as US Patent Application Publication No. US 2012/0055702.

Final Office Action mailed Jul. 31, 2014 in co-pending U.S. Appl. No. 13/320,285, now published as US Patent Application Publication No. US 2012/0055702.

Office Action mailed Aug. 26, 2014 in co-pending U.S. Appl. No. 13/318,382, now published as US Patent Application Publication No. US 2012/0043130.

Final Office Action mailed Aug. 04, 2014 in co-pending U.S. Appl. No. 13/319,145, now published as US Patent Application Publication No. 2012/0049342.

Amendment and Response filed Sep. 03, 2014 in co-pending U.S. Appl. No. 13/319,158, now published as US Patent Application Publication No. 2012/0051016.

Final Office Action mailed Aug. 20, 2014 in co-pending U.S. Appl. No. 13/319,203, now published as US Patent Application Publication No. 2012/0056640.

Office Action mailed Sep. 4, 2014 in co-pending U.S. Appl. No. 13/319,228, now published as US Patent Application Publication No. US 2012/0058653.

Amendment and Response filed Jul. 30, 2014 in co-pending U.S. Appl. No. 13/700,639, now published as US Patent Application Publication No. 2013/0078860.

Response to Restriction Requirement filed Jul. 17, 2014 in co-pending U.S. Appl. No. 13/879,783, now published as US Patent Application Publication No. 2013/0223034.

Amendment and Response Under Rule 1.116 filed Jul. 29, 2014 in co-pending U.S. Appl. No. 13/410,914, now published as US Patent Application Publication No. US 2012/0164888.

Advisory Action mailed Aug. 12, 2014 in co-pending U.S. Appl. No. 13/410,914, now published as US Patent Application Publication No. US 2012/0164888.

Restriction Requirement mailed Jul. 31, 2014 in co-pending U.S. Appl. No. 13/410,943, now published as US Patent Application Publication No. US 2012/0161317.

Response to Restriction Requirement filed Aug. 19, 2014 in co-pending U.S. Appl. No. 13/410,943, now published as US Patent Application Publication No. US 2012/0161317.

Amendment and Response filed Aug. 26, 2014 in co-pending U.S. Appl. No. 13/418,853, now published as US Patent Application Publication No. US 2012/0244728.

Co-pending U.S. Appl. No. 14/327,916 titled Matrix Defined Electrical Circuit Structure, filed Jul. 10, 2014.

Final Office Action mailed May 15, 2014 in co-pending U.S. Appl. No. 13/266,486, now published as US Patent Application Publication No. US 2012/0055701.

Notice of Allowance and Fee(s) Due mailed May 2, 2014 in co-pending U.S. Appl. No. 13/266,522, now published as US Patent Application Publication No. 2012/0068727.

Final Office Action mailed May 7, 2014 in co-pending U.S. Appl. No. 13/266,907, now published as US Patent Application Publication No. US 2012/0268155.

Amendment and Response filed Mar. 18, 2014 in co-pending U.S. Appl. No. 13/319,145, now published as US Patent Application Publication No. 2012/0049342.

Office Action mailed Jun. 27, 2014 in co-pending U.S. Appl. No. 13/319,158, now published as US Patent Application Publication No. 2012/0051016.

Amendment and Response file Jun. 10, 2014 in co-pending U.S. Appl. No. 13/319,203, now published as US Patent Application Publication No. 2012/0056640.

Response to Restriction Requirement filed Jun. 23, 2014 in co-pending U.S. Appl. No. 13/319,228, now published as US Patent Application Publication No. US 2012/0058653.

Restriction Requirement mailed Jun. 5, 2014 in co-pending U.S. Appl. No. 13/879,783, now published as US Patent Application Publication No. 2013/0223034.

Final Office Action mailed Jun. 4, 2014 in co-pending U.S. Appl. No. 13/410,914, now published as US Patent Application Publication No. US 2012/0164888.

Notice of Allowance and Fee(s) Due mailed May 9, 2014 in co-pending U.S. Appl. No. 13/413,724, now published as US Patent Application Publication No. US 2012/0168948.

Response to Restriction Requirement filed Apr. 23, 2014 in co-pending U.S. Appl. No. 13/418,853, now published as US Patent Application Publication No. US 2012/0244728.

Office Action mailed Jun. 26, 2014 in co-pending U.S. Appl. No. 13/418,853, now published as US Patent Application Publication No. US 2012/0244728.

\* cited by examiner

METHOD OF MAKING A COMPLIANT PRINTED CIRCUIT PERIPHERAL LEAD SEMICONDUCTOR PACKAGE

CROSS-REFERENCE TO RELATED APPLICATIONS

This application is a national stage application under 35 U.S.C. §371 of International Application No. PCT/US2010/036055, titled COMPLIANT PRINTED CIRCUIT PERIPHERAL LEAD SEMICONDUCTOR PACKAGE, filed May 25, 2010, which claims priority to U.S. Provisional Application No. 61/183,365, filed Jun. 2, 2009, both of which are hereby incorporated by reference in their entireties.

TECHNICAL FIELD

The present disclosure leverages the capabilities of the additive printing process to create a no lead IC package that has internal compliance near the terminals that are soldered to the PCB. The printing process provides unique opportunity to add function or performance enhancement within the package structure not seen in traditional packages.

BACKGROUND OF THE INVENTION

Traditional semiconductors and IC devices are typically packaged in a variety of ways to provide redistribution from the terminals on the die to a spacing that is conducive to cost effective printed circuit board ("PCB") fabrication techniques. In many cases, the size and distance between die terminals is so small that the device cannot be connected to the final PCB without some sort of fan out or routing. The packages also serve to protect the fragile silicon or provide additional functions such as thermal management or near device decoupling. In many cases, the size and distance between die terminals is so small that the IC device cannot be connected to the final PCB without some sort of re-routing interface.

Most IC devices are produced with terminals in either a peripheral pattern that runs along the edges of the IC device or an area array pattern that spans across the surface of the IC device. Devices with the terminals along the edge are typically connected to the package by a method called wirebonding, where a very fine wire is bonded to the terminal and strung in a controlled manner to the corresponding package lead.

After all the terminals are connected, the package is typically overmolded with a plastic material to protect the wirebonds and keep them from dislodging or shorting to each other. In most cases, the connection of the IC device to the package is generally not reworkable once packaged and if there is a missing or broken connection it is difficult to repair.

The terminals on the package are generally transitioned to the PCB in two main ways. The first version includes a metal leadframe with formed metal leads extend from the package in what is called a gullwing shape. The leads are placed into solder which is reflowed to provide the final connection to the PCB. In the second version, the formed leads are left off the package which is often called a no lead configuration. This version is constructed with a trace or pad that is soldered directly to the corresponding pad on the PCB using solder paste which is reflowed.

Both methods have benefits and limitations. The leadframe style packages have been in use for many years, and have a low cost due to the established infrastructure. One of the big benefits of this style is the formed metal leads act as a flexible member that helps to decouple the stress induced when the PCB and the package expand and contract during thermal cycles as well as during a shock event. This stress decoupling adds to the reliability of the interconnect. The metal leadframe approach, however, is primarily used for relatively low pin count applications. The leads and wirebonds also have a relatively high inductance which can degrade electrical performance.

The no lead package approach have been very popular in recent years for wireless and power applications. The elimination of the formed metal lead extending from the package reduces cost and improves electrical performance by eliminating the leads. One limitation of the no lead types of packages is the lack of compliance at the terminal when soldered to the PCB. The solder reflowed to join the pad on the package to the pad on the PCB can see significant stress during thermal cycling or physical shock such as dropping a cell phone.

There also have been advancements in recent years in both package types where multiple IC devices are placed in the same package, creating what has been nicknamed SiP or "system in package". Placing multiple IC devices in a single package further complicates the problems discussed above.

BRIEF SUMMARY OF THE INVENTION

The present disclosure relates to the use of additive printing processes to create a compliant printed circuit semiconductor package that has internal compliance near the terminal that are soldered to the PCB. The printing process provides unique opportunity to add function or performance enhancement within the package structure not seen in traditional packages. The present semiconductor package can be used with single or multiple IC devices.

The present compliant printed circuit semiconductor package resembles a traditional package in construction, but utilizes additive printing processes rather than conventional subtractive processes. The unique nature of the additive printing processes allows for a direct writing of circuitry and dielectrics, with the added benefit of stress decoupling at the terminal joints as well as embedded function not seen in traditional packaging. The present semiconductor package combines the electrical performance of the no lead with the compliance of the leadframe approach.

The use of additive printing processes permits the material set in a given layer to vary. Traditional PCB and flex circuit fabrication methods take sheets of material and stack them up, laminate, and/or drill. The materials in each layer are limited to the materials in a particular sheet. Additive printing technologies permit a wide variety of materials to be applied on a layer with a registration relative to the features of the previous layer. Selective addition of conductive, non-conductive, or semi-conductive materials at precise locations to create a desired effect has the major advantages in tuning impedance or adding electrical function on a given layer. Tuning performance on a layer by layer basis relative to the previous layer greatly enhances electrical performance.

One embodiment is directed to a compliant printed circuit semiconductor package including a compliant printed circuit with at least a first dielectric layer selectively printed on a substrate creating first recesses. Conductive material is printed in the first recesses forming contact members accessible along a first surface of the compliant printed circuit. At least one semiconductor device is located proximate the first surface of the compliant printed circuit. Wirebonds electrically couple terminals on the semiconductor device to the contact members. Overmolding material seals the semiconductor device and the wirebonds to the first surface of the compliant printed circuit. Contact pads on a second surface of the compliant printed circuit are electrically coupled to the contact members. The contact pads permit the compliant printed circuit semiconductor package to be electrically coupled to other circuit members.

In another embodiment, a plurality of dielectric layers are selectively printed on the first dielectric layer to create a plurality of second recesses corresponding to a target circuit geometry. A conductive material is printed in at least a portion of the second recesses to create circuit geometry electrically coupling the contact members with the contact pads. Conductive plating is optionally applied on one or more of the contact members and the circuit geometry. The conductive material can be sintered conductive particles or a conductive ink.

The resulting circuit geometry preferably has conductive traces that have substantially rectangular cross-sectional shapes, corresponding to the second recesses. The use of additive printing processes permit conductive material, non-conductive material, and semi-conductive material to be located on a single layer.

In one embodiment, pre-formed conductive trace materials are located in the second recesses. The second recesses are then plated to form conductive traces with substantially rectangular cross-sectional shapes. In another embodiment, a conductive foil is pressed into at least a portion of the second recesses. The conductive foil is sheared along edges of the second recesses. The excess conductive foil not located in the second recesses is removed and the second recesses are plated to form conductive traces with substantially rectangular cross-sectional shapes.

In another embodiment, compliant material is located between the contact pads and the first dielectric layer. Electrical devices can optionally be printed on one of the dielectric layers and electrically coupled to at least one of the contact members. In some embodiments the contact pads extend above the compliant printed circuit.

A plurality of semiconductor devices can be located proximate the first surface of the compliant printed circuit. A plurality of wirebonds electrically couple terminals on the semiconductor devices to contact members on the compliant printed circuit. The circuit geometry can optionally include one of an inter-die circuit path or an intra-die circuit paths.

The present disclosure is also directed an electrical assembly including the contact pads on the present semiconductor package electrically coupled to another circuit member. The circuit member can be selected from one of a dielectric layer, a printed circuit board, a flexible circuit, a bare die device, an integrated circuit device, organic or inorganic substrates, or a rigid circuit.

The present disclosure is also directed to a method of making a compliant printed circuit semiconductor package. The steps include selectively printing at least a first dielectric layer on a substrate to create a plurality of first recesses. The conductive material is printed in the first recesses to form contact members accessible along a first surface of a compliant printed circuit and contact pads accessible along a second surface, where the contact members are electrically coupled to the contact pads. At least one semiconductor device is located proximate the first surface of the compliant printed circuit. Wirebonding connects terminals on the semiconductor device to the contact members. An overmolding material retains the semiconductor device and the wirebonds to the first surface of the compliant printed circuit.

The present compliant printed circuit semiconductor package enables internal and/or external compliance to enhance the mechanical performance of the circuit. The semiconductor package can be produced digitally, without tooling or costly artwork. The semiconductor package can be produced as a "Green" product, with dramatic reductions in environmental issues related to the production of conventional semiconductor packages.

The present disclosure is also directed to several additive processes that combine the mechanical or structural properties of a polymer material, while adding metal materials in an unconventional fashion, to create electrical paths that are refined to provide electrical performance improvements. By adding or arranging metallic particles, conductive inks, plating, or portions of traditional alloys, the compliant printed semiconductor package reduces parasitic electrical effects and impedance mismatch, potentially increasing the current carrying capacity.

The printing process permits the fabrication of functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The compliant printed circuit can be planar and non-planar surfaces. The printing process is typically followed by a thermal treatment, such as in a furnace or with a laser, to achieve dense functionalized structures.

The compliant printed circuit semiconductor package can be configured with conductive traces that reduce or redistribute the terminal pitch, without the addition of an interposer or daughter substrate. Grounding schemes, shielding, electrical devices, and power planes can be added to the semiconductor package, reducing the number of connections to the PCB and relieving routing constraints while increasing performance.

DETAILED DESCRIPTION OF THE INVENTION

Figure 1:
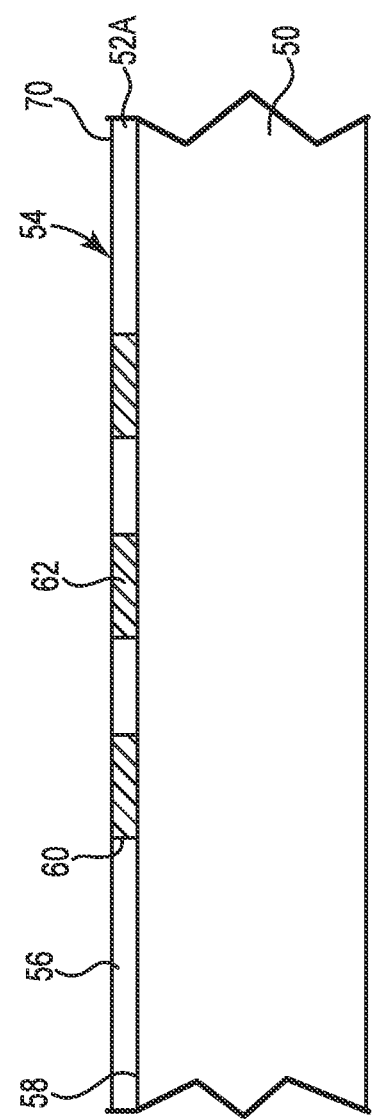
FIG. 1 is a cross-sectional view of a method of making a compliant printed circuit semiconductor package in accordance with an embodiment of the present disclosure.

FIG. 1 is a side sectional view of substrate 50 with first layer 52A of a compliant printed circuit 54 for making a semiconductor package in accordance with an embodiment of the present disclosure. In the preferred embodiment, the first layer 52A includes dielectric material 56 selectively printed on surface 58 of the substrate 50.

Figure 2:
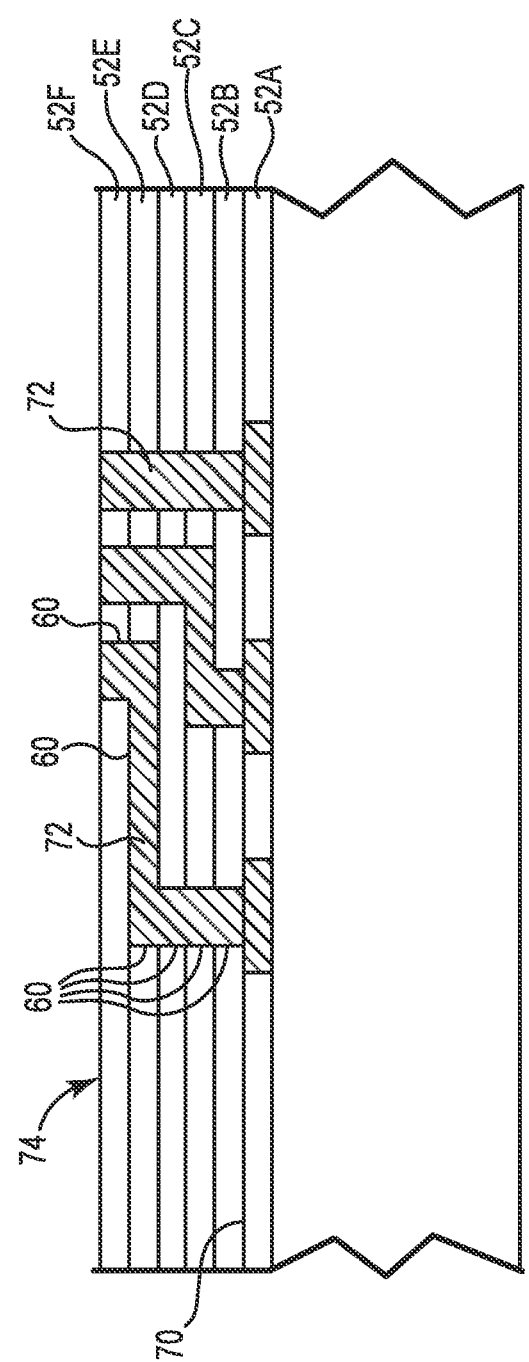
FIG. 2 is a cross-sectional view of the compliant printed circuit semiconductor package of FIG. 1 with additional printed layers.

Recesses 60 in the dielectric material 56 are then metalized to create contact members 62. Metalizing can be performed by printing conductive particles followed by a sintering step, by printing conductive inks, or a variety of other techniques. The metalizing material is preferably of copper or similar metallic materials such as phosphor bronze or beryllium-copper. The resulting contact members 62 are optionally plated to improve conductive properties. The plating is preferably a corrosion resistant metallic material such as nickel, gold, silver, palladium, or multiple layers thereof. FIG. 2 illustrates additional printed layers 52B, 52C, 52D, 52E, 52F (collectively "52") printed to top surface 70 of the first layer 52A. Each layer includes dielectric material 56 selectively printed to form recesses or trenches 60 that are subsequently metalized to create circuit geometry 72 for compliant printed circuit 74.

The dielectric material may be constructed of any of a number of materials that provide electrostatic dissipation or to reduce cross-talk between the traces of the circuit geometry 72. An efficient way to prevent electrostatic discharge ("ESD") is to construct one of the layers from materials that are not too conductive but that will slowly conduct static charges away. These materials preferably have resistivity values in the range of $10^5$ to $10^{11}$ Ohm-meters.

In one embodiment, the circuit geometry 72 is formed by depositing a conductive material in a first state in the recesses 60 in the dielectric material 56, and then processed to create a second more permanent state. For example, the metallic powder is printed according to the circuit geometry and subsequently sintered, or the curable conductive material flows into the circuit geometry and is subsequently cured. As used herein "cure" and inflections thereof refers to a chemical-physical transformation that allows a material to progress from a first form (e.g., flowable form) to a more permanent second form. "Curable" refers to an uncured material having the potential to be cured, such as for example by the application of a suitable energy source.

The recesses 60 in the layers 52 permit control of the location, cross section, material content, and aspect ratio of the contact members 62 and the conductive traces in the circuit geometry 72. Maintaining the conductive traces with a cross-section of 1:1 or greater provides greater signal integrity than traditional subtractive trace forming technologies. For example, traditional methods take a sheet of a given thickness and etches the material between the traces away to have a resultant trace that is usually wider than it is thick. The etching process also removes more material at the top surface of the trace than at the bottom, leaving a trace with a trapezoidal cross-sectional shape, degrading signal integrity in some applications. Using the recesses 60 to control the aspect ratio of the conductive traces results in a more rectangular or square cross-section of the conductive traces in the circuit geometry 72, with the corresponding improvement in signal integrity.

In another embodiment, pre-patterned or pre-etched thin conductive foil circuit traces are transferred to the recesses 60. For example, a pressure sensitive adhesive can be used to retain the copper foil circuit traces in the recesses 60. The trapezoidal cross-sections of the pre-formed conductive foil traces are then post-plated. The plating material fills the open spaces in the recesses 60 not occupied by the foil circuit geometry, resulting in a substantially rectangular or square cross-sectional shape corresponding to the shape of the recesses 60.

In another embodiment, a thin conductive foil is pressed into the recesses 60, and the edges of the recesses 60 act to cut or shear the conductive foil. The process locates a portion of the conductive foil in the trenches 60, but leaves the negative pattern of the conductive foil not wanted outside and above the trenches 60 for easy removal. Again, the foil in the trenches 60 is preferably post plated to add material to increase the thickness of the conductive traces in the circuit geometry 72 and to fill any voids left between the conductive foil and the recesses 60.

Figure 3:
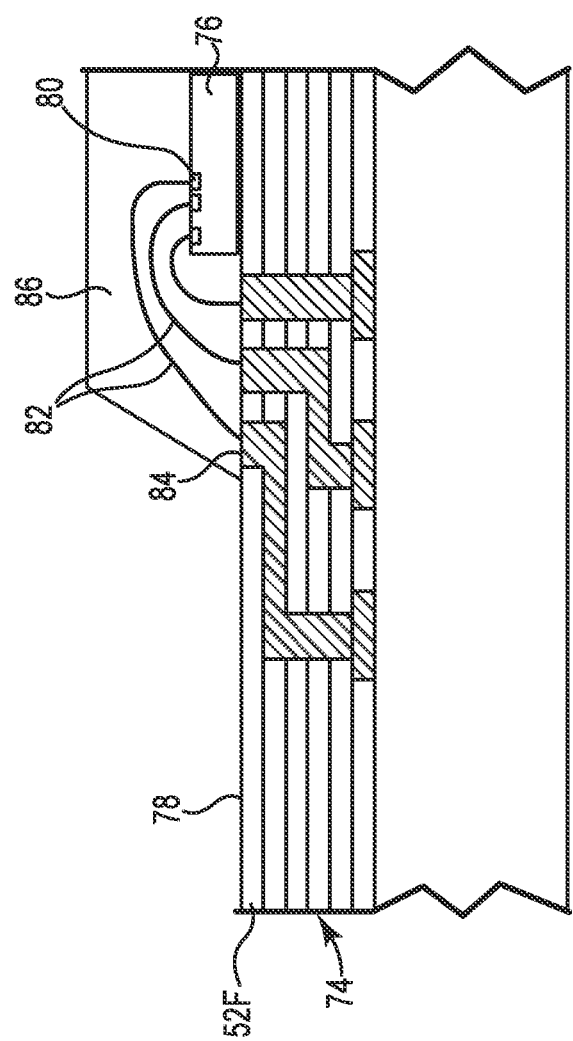
FIG. 3 is a cross-sectional view of a semiconductor device incorporated into the compliant printed circuit semiconductor package of FIG. 2.

FIG. 3 illustrates semiconductor device 76 located on surface 78 of the layer 52F. Terminals 80 on the semiconductor device 76 are wire bonded 82 to contact members 84 on the compliant printed circuit 74. Overmolding material 86 is then applied to the semiconductor device 76 and the wirebonds 82 similar to conventional IC device packaging.

Figure 4:
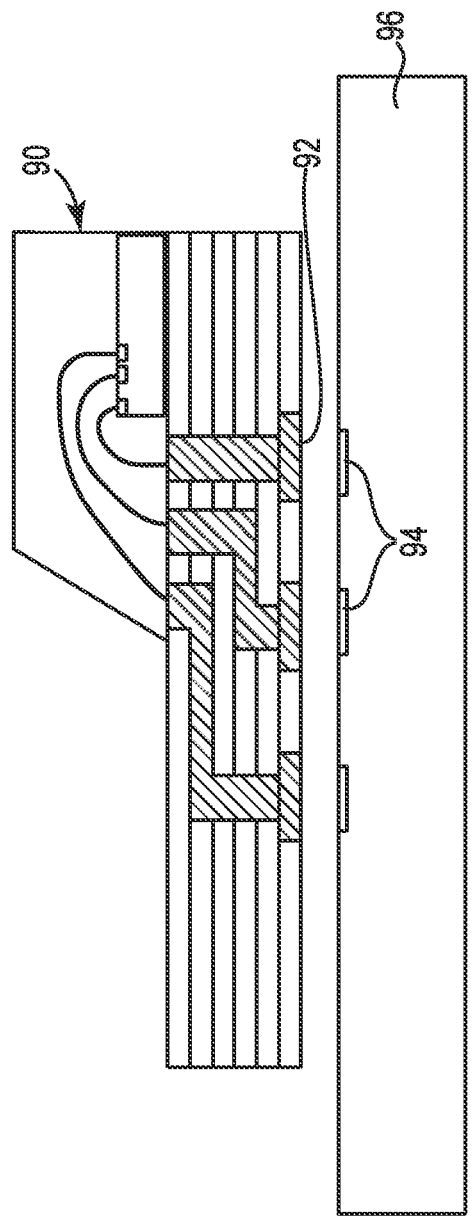
FIG. 4 illustrates the compliant printed circuit semiconductor package of FIG. 3 electrically coupled to a circuit member in accordance with an embodiment of the present disclosure.

FIG. 4 illustrates the resulting compliant printed circuit semiconductor package 90 with the substrate 50 removed. Contact pads 92 are now exposed and positioned to electrically couple with contact pads 94 on circuit member 96. The contact pads 92, 94 can be compressively engaged for a temporary connection or soldered. As used herein, the term "circuit members" refers to, for example, a packaged integrated circuit device, an unpackaged integrated circuit device, a printed circuit board, a flexible circuit, a bare-die device, an organic or inorganic substrate, a rigid circuit, or any other device capable of carrying electrical current.

Figure 5:
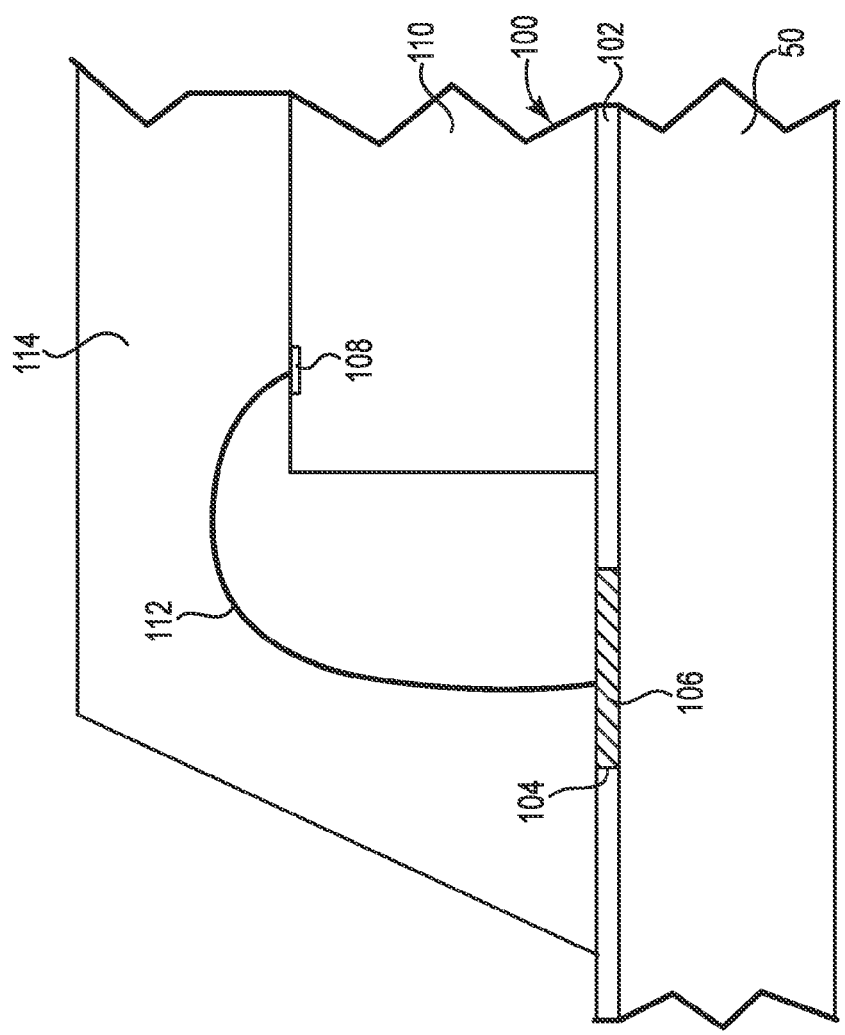
FIG. 5 is a cross-sectional view of a compliant printed circuit semiconductor package in accordance with another embodiment of the present disclosure.
Figure 6:
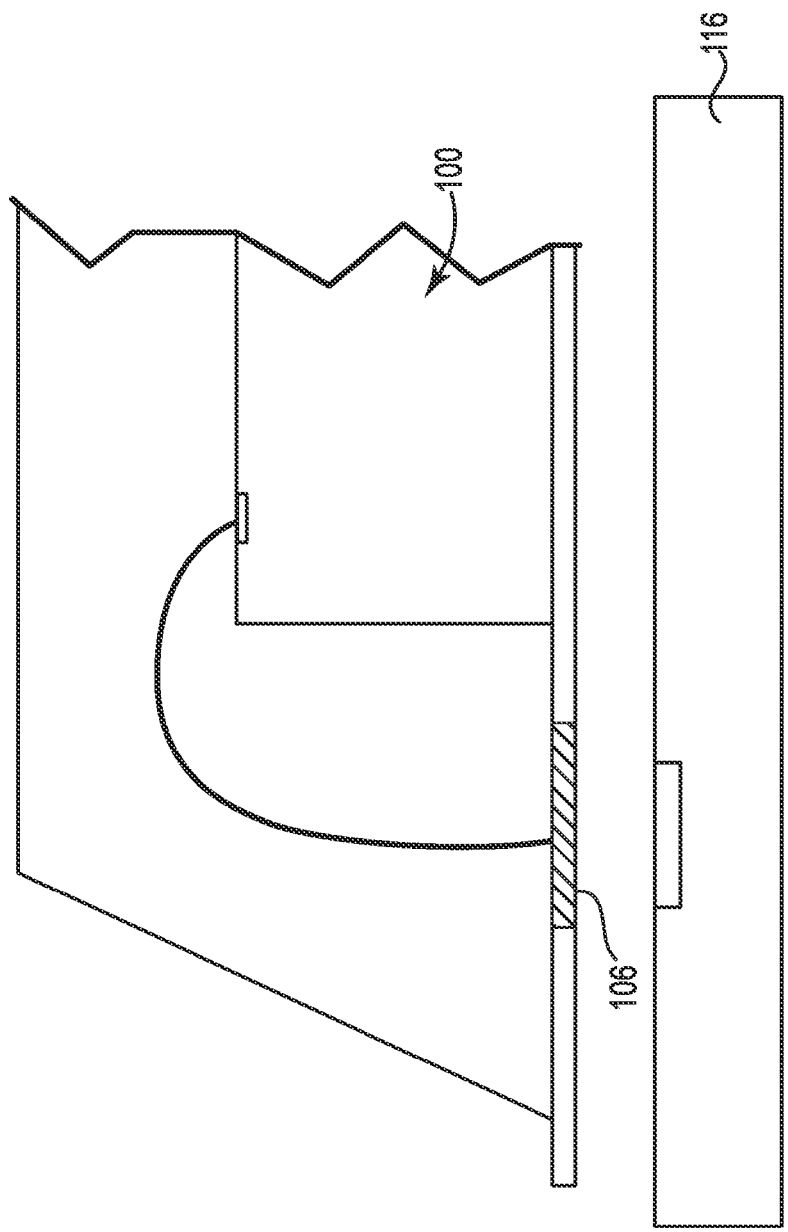
FIG. 6 illustrates the compliant printed circuit semiconductor package of FIG. 5 engaged with a circuit member in accordance with an embodiment of the present disclosure.

FIG. 5 illustrates a simplified compliant printed circuit semiconductor package 100 in accordance with an embodiment of the present disclosure. A single dielectric layer 102 is printed on the substrate 50. Recesses 104 are metalized as discussed above to form contact members 106. Terminals 108 on the semiconductor device 110 are wire bonded 112 to the contact members 106, and the assembly is overmolded 114. FIG. 6 illustrates the compliant printed circuit semiconductor package 100 with the substrate 50 removed and exposed contact member 106 engaged with circuit member 116.

Figure 7:
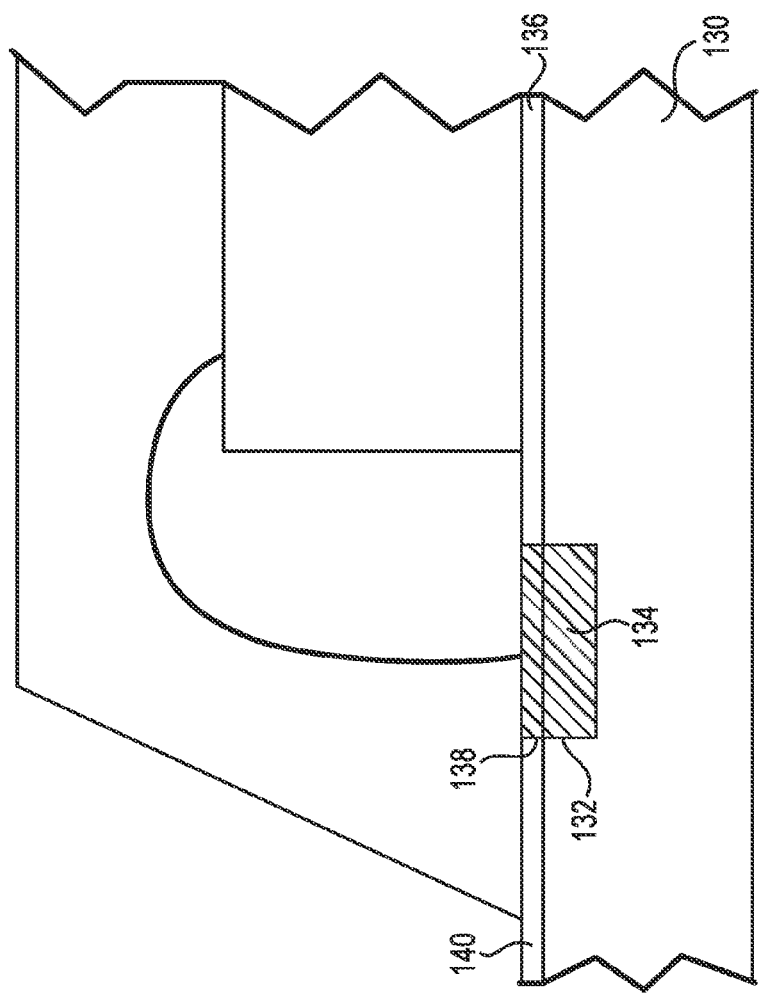
FIG. 7 is a cross-sectional view of an alternate compliant printed circuit semiconductor package in accordance with an embodiment of the present disclosure.
Figure 8:
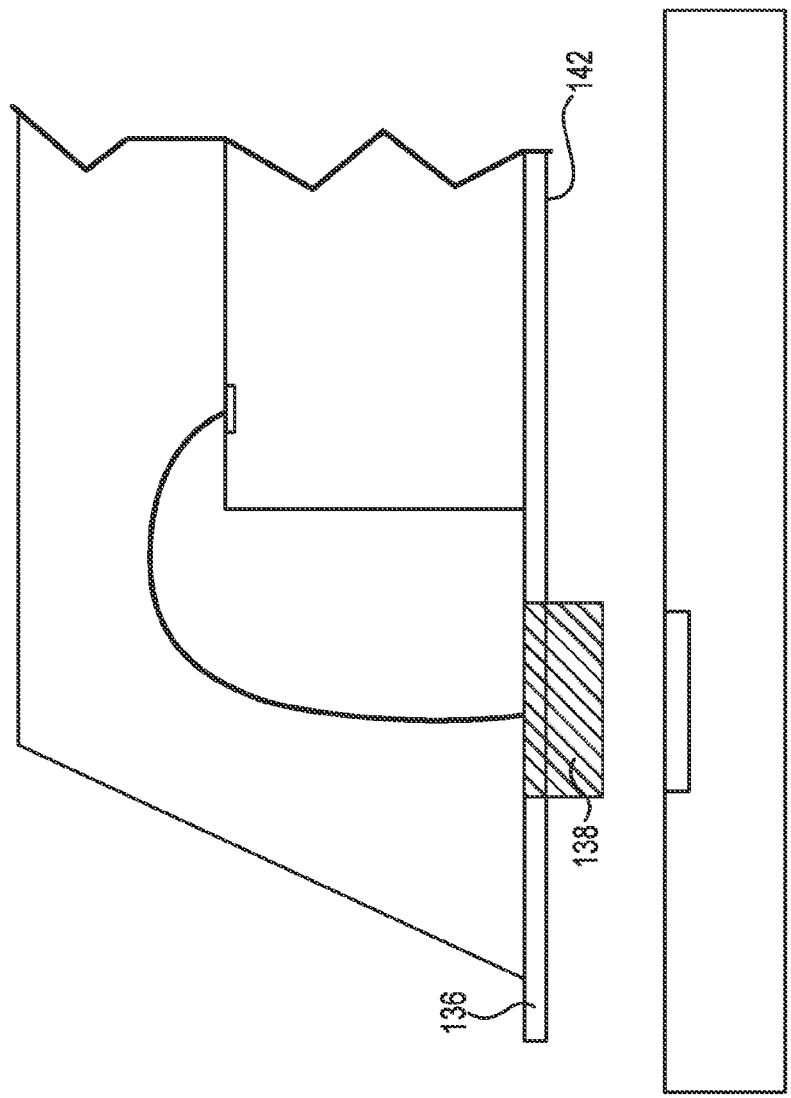
FIG. 8 illustrates the compliant printed circuit semiconductor package of FIG. 7 engaged with a circuit member in accordance with an embodiment of the present disclosure.

FIG. 7 illustrates alternate substrate 130 with recess 132 for extending contact member 134 above compliant printed circuit 136 in accordance with an embodiment of the present disclosure. Recess 138 in printed dielectric layer 140 and recess 132 are metalized as discussed above. As illustrated in FIG. 8, contact member 134 extends above surface 142 of the compliant printed circuit 136. The contact member 134 provides a standoff that allows for flux cleaning after reflow, providing added reliability.

Figure 9:
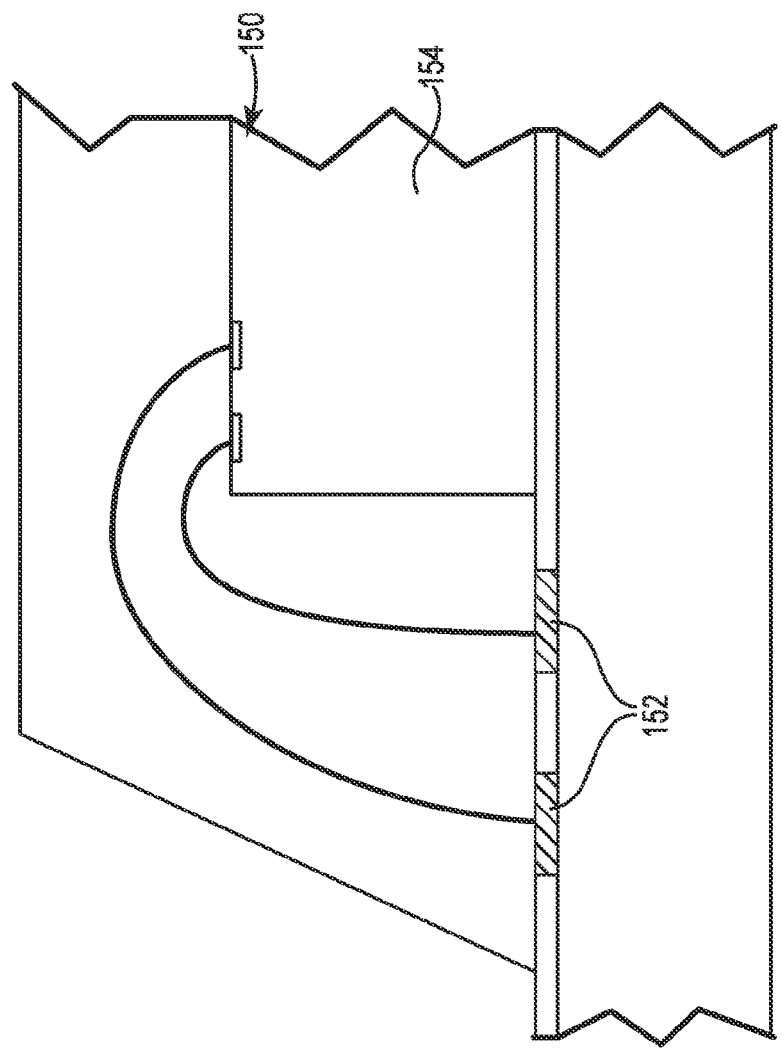
FIG. 9 is a cross-sectional view of an alternate compliant printed circuit semiconductor package with staggered leads in accordance with an embodiment of the present disclosure.

FIG. 9 illustrates an alternate compliant printed circuit semiconductor package 150 with staggered or tiered bond pads 152 in accordance with an embodiment of the present disclosure. The size and pitch of contact pads 152 can be printed to electrically couple IC device 154 to another circuit member with a contact-to-contact spacing (pitch) on the order of less than 1.0 mm pitch, and more preferably a pitch of less than about 0.7 millimeter, and most preferably a pitch of less than about 0.4 millimeter.

Figure 10:
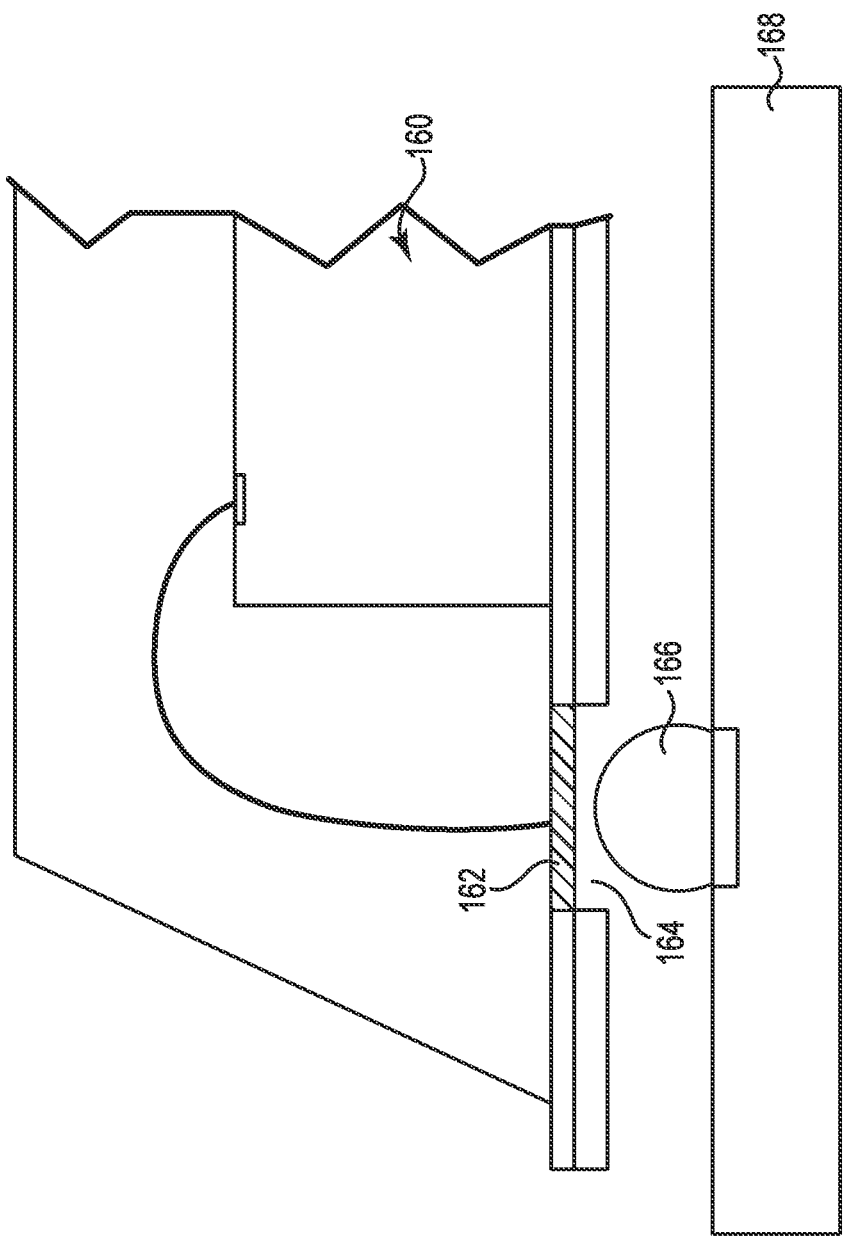
FIG. 10 is a cross-sectional view of an alternate compliant printed circuit semiconductor package with a recessed contact pad to contain solder reflow in accordance with an embodiment of the present disclosure.

FIG. 10 illustrates another compliant printed circuit semiconductor package 160 with a recessed pad 162 in accordance with an embodiment of the present disclosure. Recess 164 is optionally printed with a bonding agent or a pre-applied underfill that engages when solder ball 166 on circuit member 168 is reflowed.

Figure 11:
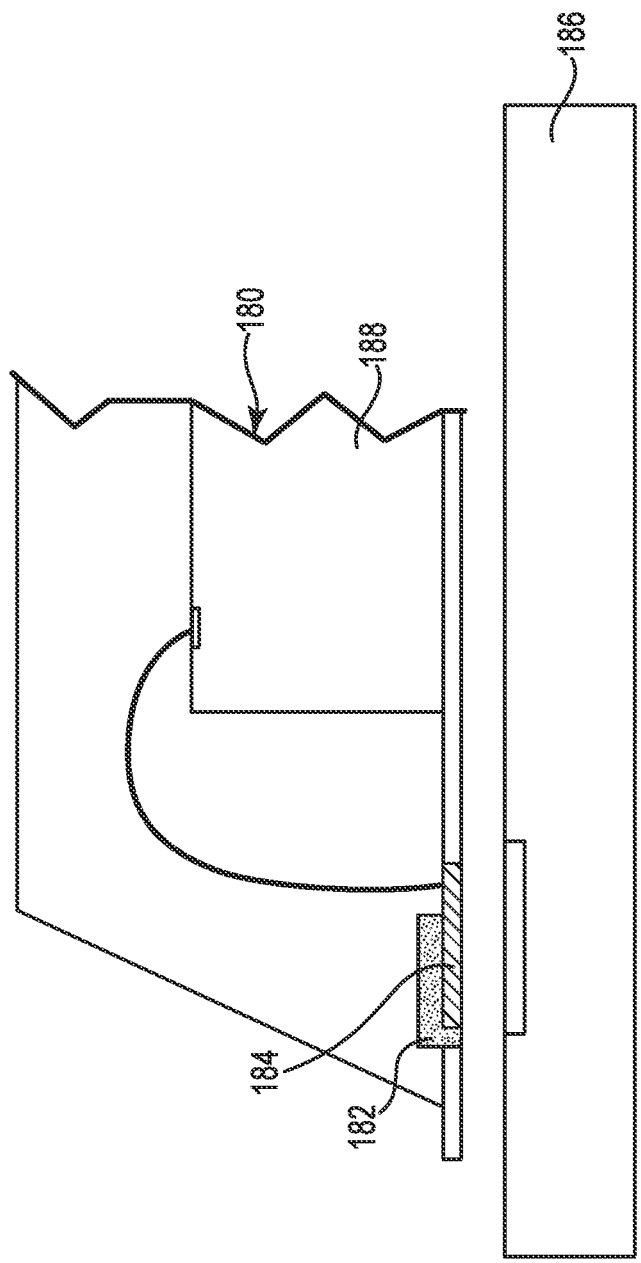
FIG. 11 is a cross-sectional view of an alternate compliant printed circuit semiconductor package with a printed compliant region in accordance with an embodiment of the present disclosure.

FIG. 11 illustrates a compliant printed circuit semiconductor package 180 with resilient material 182 printed adjacent to contact pad 184. The resilient material 182 permits the contact pad 184 to move in all six degrees of freedom (X-Y-Z-Pitch-Roll-Yaw) to facilitate electrical coupling with circuit member 186.

The resilient material 182 is also useful to compressively couple the compliant printed circuit semiconductor package 180 with another circuit member 186. For example, the present semiconductor package 180 permits the performance of IC device 188 to be evaluated before being incorporated into a system in package or multi-chip module, permitting the individual die to be replaced if necessary.

Figure 12:
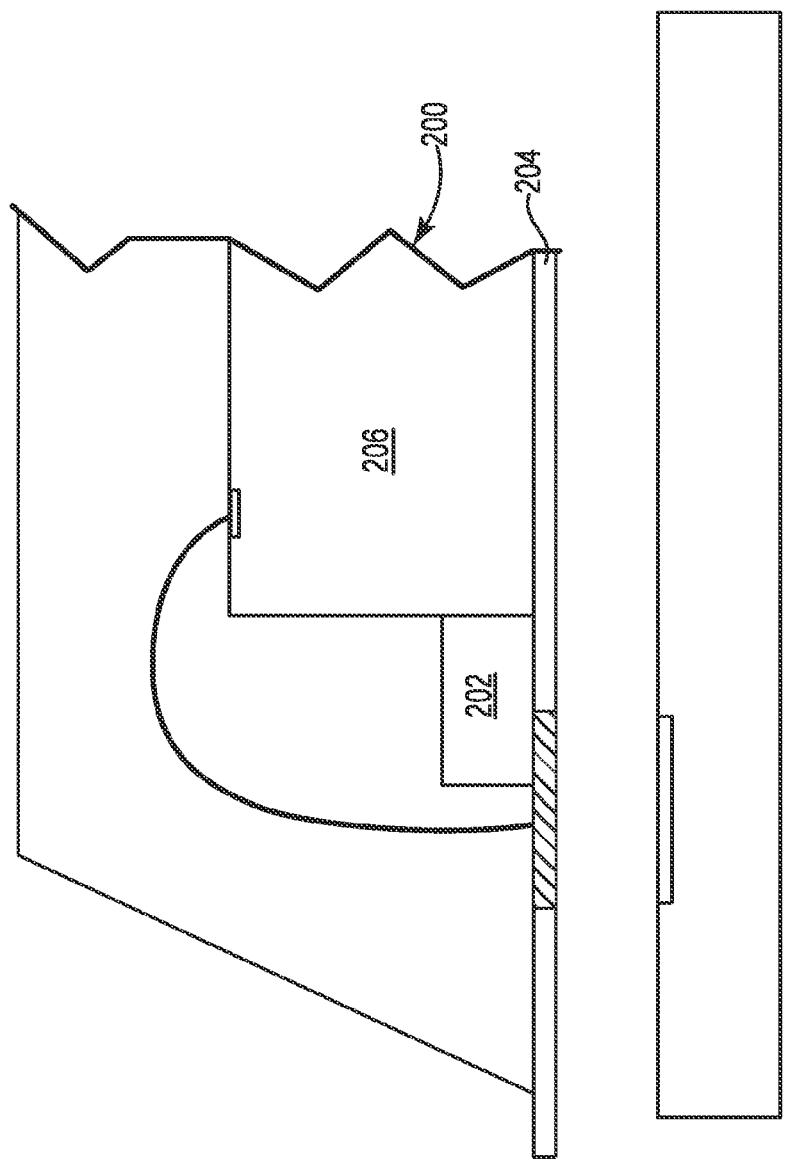
FIG. 12 is a cross-sectional view of an alternate compliant printed circuit semiconductor package with printed electrical devices in accordance with an embodiment of the present disclosure.

FIG. 12 illustrates an alternate compliant printed circuit semiconductor package 200 with printed electrical devices 202 in accordance with an embodiment of the present disclosure. The electrical devices 202 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like. The electrical devices 202 are preferably printed during construction of the compliant printed circuit 204. The electrical devices 202 can be ground planes, power planes, electrical connections to other circuit members, dielectric layers, conductive traces, transistors, capacitors, resistors, RF antennae, shielding, filters, signal or power altering and enhancing devices, memory devices, embedded IC, and the like. For example, the electrical devices 202 can be formed using printing technology, adding intelligence to the semiconductor package 200. Features that are typically located on the IC device 206 can be incorporated into the semiconductor package 200 in accordance with an embodiment of the present disclosure.

The availability of printable silicon inks provides the ability to print electrical devices 202, such as disclosed in U.S. Pat. No. 7,485,345 (Renn et al.); U.S. Pat. No. 7,382,363 (Albert et al.); U.S. Pat. No. 7,148,128 (Jacobson); U.S. Pat. No. 6,967,640 (Albert et al.); U.S. Pat. No. 6,825,829 (Albert et al.); U.S. Pat. No. 6,750,473 (Amundson et al.); U.S. Pat. No. 6,652,075 (Jacobson); U.S. Pat. No. 6,639,578 (Comiskey et al.); U.S. Pat. No. 6,545,291 (Amundson et al.); U.S. Pat. No. 6,521,489 (Duthaler et al.); U.S. Pat. No. 6,459,418 (Comiskey et al.); U.S. Pat. No. 6,422,687 (Jacobson); U.S. Pat. No. 6,413,790 (Duthaler et al.); U.S. Pat. No. 6,312,971 (Amundson et al.); U.S. Pat. No. 6,252,564 (Albert et al.); U.S. Pat. No. 6,177,921 (Comiskey et al.); U.S. Pat. No. 6,120,588 (Jacobson); U.S. Pat. No. 6,118,426 (Albert et al.); and U.S. Pat. Publication No. 2008/0008822 (Kowalski et al.), which are hereby incorporated by reference. In particular, U.S. Pat. No. 6,506,438 (Duthaler et al.) and U.S. Pat. No. 6,750,473 (Amundson et al.), which are incorporated by reference, teach using ink-jet printing to make various electrical devices, such as, resistors, capacitors, diodes, inductors (or elements which may be used in radio applications or magnetic or electric field transmission of power or data), semiconductor logic elements, electro-optical elements, transistor (including, light emitting, light sensing or solar cell elements, field effect transistor, top gate structures), and the like.

The electrical devices 202 can also be created by aerosol printing, such as disclosed in U.S. Pat. No. 7,674,671 (Renn et al.); U.S. Pat. No. 7,658,163 (Renn et al.); U.S. Pat. No. 7,485,345 (Renn et al.); U.S. Pat. No. 7,045,015 (Renn et al.); and U.S. Pat. No. 6,823,124 (Renn et al.), which are hereby incorporated by reference.

Printing processes are preferably used to fabricate various functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

Ink jet printing of electronically active inks can be done on a large class of substrates, without the requirements of standard vacuum processing or etching. The inks may incorporate mechanical, electrical or other properties, such as, conducting, insulating, resistive, magnetic, semi conductive, light modulating, piezoelectric, spin, optoelectronic, thermoelectric or radio frequency.

In one embodiment, a plurality of ink drops are dispensed from the print head directly to a substrate or on an intermediate transfer member. The transfer member can be a planar or non-planar structure, such as a drum. The surface of the transfer member can be coated with a non-sticking layer, such as silicone, silicone rubber, or Teflon.

The ink (also referred to as function inks) can include conductive materials, semi-conductive materials (e.g., p-type and n-type semiconducting materials), metallic material, insulating materials, and/or release materials. The ink pattern can be deposited in precise locations on a substrate to create fine lines having a width smaller than 10 microns, with precisely controlled spaces between the lines. For example, the ink drops form an ink pattern corresponding to portions of a transistor, such as a source electrode, a drain electrode, a dielectric layer, a semiconductor layer, or a gate electrode.

The substrate can be an insulating polymer, such as polyethylene terephthalate (PET), polyester, polyethersulphone (PES), polyimide film (e.g. Kapton, available from DuPont located in Wilmington, Del.; Upilex available from Ube Corporation located in Japan), or polycarbonate. Alternatively, the substrate can be made of an insulator such as undoped silicon, glass, or a plastic material. The substrate can also be patterned to serve as an electrode. The substrate can further be a metal foil insulated from the gate electrode by a non-conducting material. The substrate can also be a woven material or paper, planarized or otherwise modified on at least one surface by a polymeric or other coating to accept the other structures.

Electrodes can be printed with metals, such as aluminum or gold, or conductive polymers, such as polythiophene or polyaniline. The electrodes may also include a printed conductor, such as a polymer film comprising metal particles, such as silver or nickel, a printed conductor comprising a polymer film containing graphite or some other conductive carbon material, or a conductive oxide such as tin oxide or indium tin oxide.

Dielectric layers can be printed with a silicon dioxide layer, an insulating polymer, such as polyimide and its derivatives, poly-vinyl phenol, polymethylmethacrylate, polyvinyldenedifluoride, an inorganic oxide, such as metal oxide, an inorganic nitride such as silicon nitride, or an inorganic/organic composite material such as an organic-substituted silicon oxide, or a sol-gel organosilicon glass. Dielectric layers can also include a bicylcobutene derivative (BCB) available from Dow Chemical (Midland, Mich.), spin-on glass, or dispersions of dielectric colloid materials in a binder or solvent.

Semiconductor layers can be printed with polymeric semiconductors, such as, polythiophene, poly(3-alkyl)thiophenes, alkyl-substituted oligothiophene, polythienylenevinylene, poly(para-phenylenevinylene) and doped versions of these polymers. An example of suitable oligomeric semiconductor is alpha-hexathienylene. Horowitz, Organic Field-Effect Transistors, Adv. Mater., 10, No. 5, p. 365 (1998) describes the use of unsubstituted and alkyl-substituted oligothiophenes in transistors. A field effect transistor made with regioregular poly(3-hexylthiophene) as the semiconductor layer is described in Bao et al., Soluble and Processable Regioregular Poly(3-hexylthiophene) for Thin Film Field-Effect Transistor Applications with High Mobility, Appl. Phys. Lett. 69 (26), p. 4108 (December 1996). A field effect transistor made with a-hexathienylene is described in U.S. Pat. No. 5,659,181, which is incorporated herein by reference.

A protective layer can optionally be printed onto the electrical devices. The protective layer can be an aluminum film, a metal oxide coating, a substrate, or a combination thereof.

Organic semiconductors can be printed using suitable carbon-based compounds, such as, pentacene, phthalocyanine, benzodithiophene, buckminsterfullerene or other fullerene derivatives, tetracyanonaphthoquinone, and tetrakisimethylanimoethylene. The materials provided above for forming the substrate, the dielectric layer, the electrodes, or the semiconductor layer are exemplary only. Other suitable materials known to those skilled in the art having properties similar to those described above can be used in accordance with the present disclosure.

The ink-jet print head preferably includes a plurality of orifices for dispensing one or more fluids onto a desired media, such as for example, a conducting fluid solution, a semiconducting fluid solution, an insulating fluid solution, and a precursor material to facilitate subsequent deposition. The precursor material can be surface active agents, such as octadecyltrichlorosilane (OTS).

Alternatively, a separate print head is used for each fluid solution. The print head nozzles can be held at different potentials to aid in atomization and imparting a charge to the droplets, such as disclosed in U.S. Pat. No. 7,148,128 (Jacobson), which is hereby incorporated by reference. Alternate print heads are disclosed in U.S. Pat. No. 6,626,526 (Ueki et al.), and U.S. Pat. Publication No. 2006/0044357 (Andersen et al.) and 2009/0061089 (King et al.), which are hereby incorporated by reference.

The print head preferably uses a pulse-on-demand method, and can employ one of the following methods to dispense the ink drops: piezoelectric, magnetostrictive, electromechanical, electro pneumatic, electrostatic, rapid ink heating, magneto hydrodynamic, or any other technique well known to those skilled in the art. The deposited ink patterns typically undergo a curing step or another processing step before subsequent layers are applied.

While ink jet printing is preferred, the term "printing" is intended to include all forms of printing and coating, including: pre-metered coating such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; screen printing processes; electrostatic printing processes; thermal printing processes; and other similar techniques.

Figure 13:
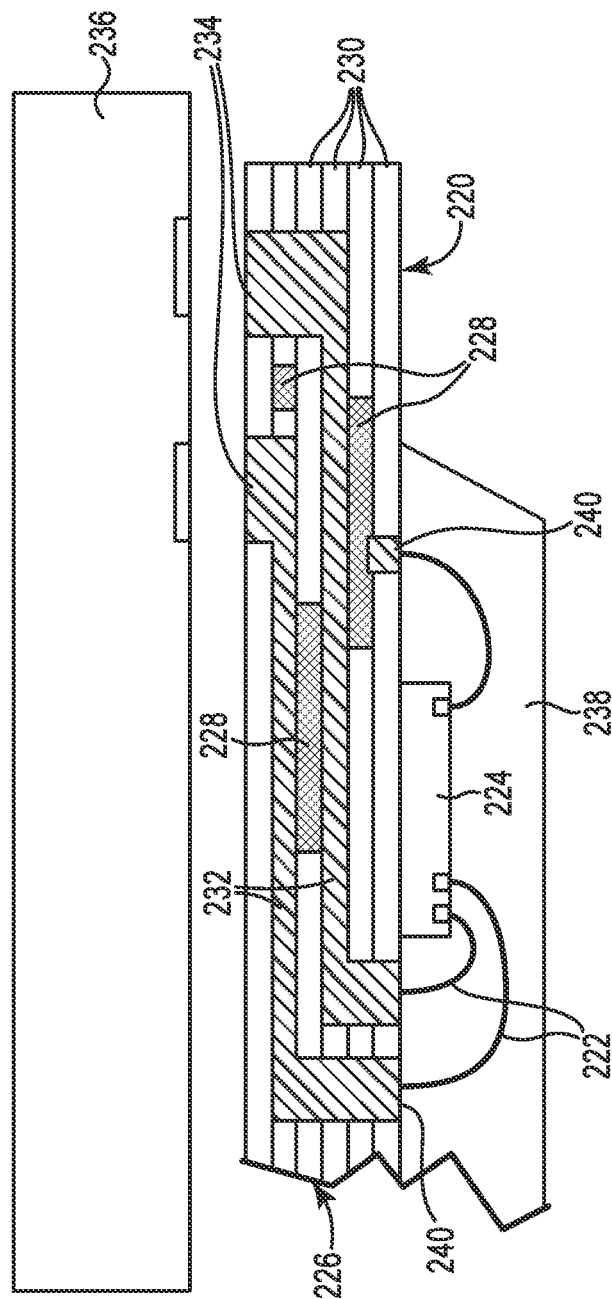
FIG. 13 is a cross-sectional view of an alternate compliant printed circuit semiconductor package with a printed circuit geometry and printed electrical devices in accordance with an embodiment of the present disclosure.

FIG. 13 illustrates compliant printed circuit semiconductor package 220 in accordance with an embodiment of the present disclosure. Wirebonds 222 electrical couple IC device 224 with contact members 240 on compliant printed circuit 226. Overmolding material 238 encapsulates the IC device 224 and wirebonds 222. Electrical devices 228 are printed in the various layers 230 of the compliant printed circuit 226. Circuit geometry 232 reroutes terminals 240 on the IC device 224 and includes exposed contact pads 234 configured to couple with circuit member 236.

Figure 14:
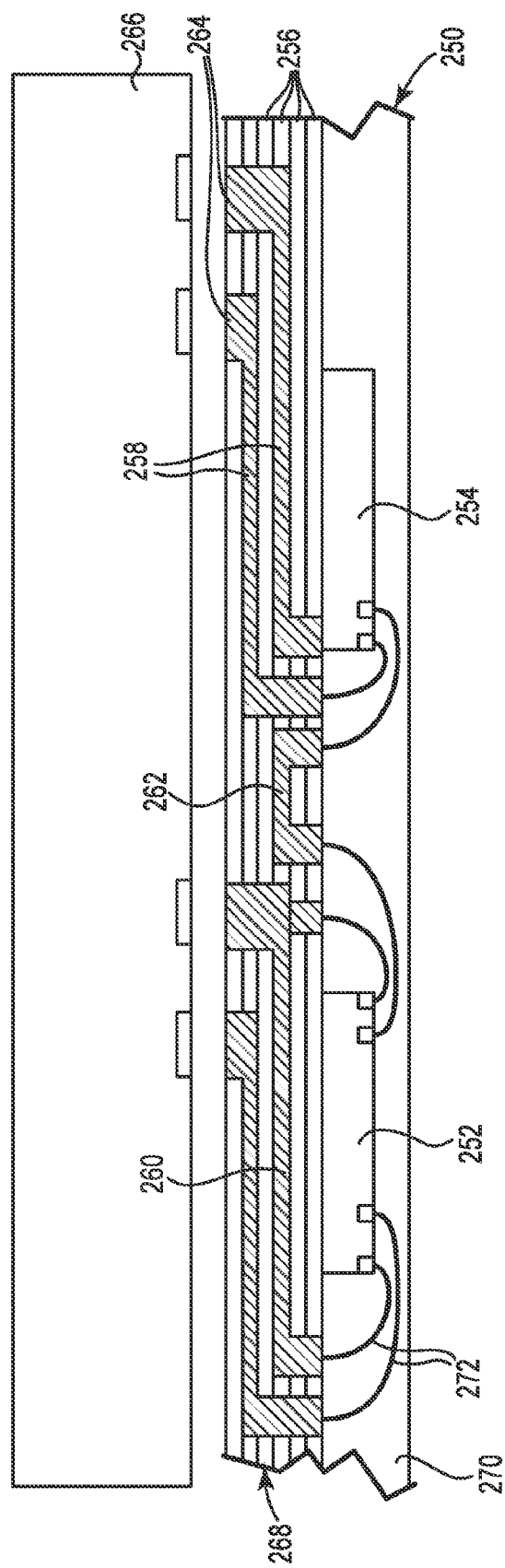
FIG. 14 is a cross-sectional view of a multichip compliant printed circuit semiconductor package with a printed circuit geometry in accordance with an embodiment of the present disclosure.

FIG. 14 illustrates a compliant printed circuit semiconductor package 250 that simulates a system in package (SIP) or multichip module format, in accordance with an embodiment of the present disclosure. Multiple IC devices 252, 254 are incorporated into the semiconductor package 250 by overmolding material 270 and wirebonds 272. Dielectric layers 256 and circuit geometry 258 are printed on the compliant printed circuit 268 as discussed above. The circuit geometry 258 permits inter-die circuit paths 260 and intra-die circuit paths 262. Contact pads 264 can be configured in a variety of ways to couple with circuit member 266.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the disclosure. The upper and lower limits of these smaller ranges which may independently be included in the smaller ranges is also encompassed within the embodiments of the disclosure, subject to any specifically excluded limit in the stated range. Where the stated range includes one or both of the limits, ranges excluding either both of those included limits are also included in the embodiments of the present disclosure.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates which may need to be independently confirmed.

Other embodiments of the disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the disclosure. Thus, it is intended that the scope of the present disclosure herein disclosed should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

What is claimed is:

1. A method of making a compliant printed circuit semiconductor package comprising the steps of:
   selectively printing at least a first dielectric layer on a substrate to create a plurality of first recesses;
   metalizing the first recesses to form contact members accessible along a first surface of a compliant printed circuit and contact pads accessible along a second surface, where the contact members are electrically coupled to the contact pads;
   locating a plurality of semiconductor devices proximate the first surface of the compliant printed circuit;
   forming a plurality of dielectric layers on the first dielectric layer;
   forming a circuit geometry in at least one of the plurality of dielectric layers to include at least one intra-die circuit path
   wirebonding terminals on the semiconductor devices to the contact members; and
   overmolding the semiconductor devices and the wirebonds to the first surface of the compliant printed circuit.

2. The method of claim 1 comprising the steps of:
   selectively printing a plurality of dielectric layers on the first dielectric layer to create a plurality of second recesses corresponding to a target circuit geometry; and
   plating conductive material in at least a portion of the second recesses comprising circuit geometry electrically coupling the contact members with the contact pads.

3. The method of claim 2 wherein conductive traces in the circuit geometry comprise substantially rectangular cross-sectional shapes.

4. The method of claim 2 comprising locating a conductive material, a non-conductive material, and a semi-conductive material on a single layer.

5. The method of claim 2 comprising the steps of:
   locating pre-formed conductive trace materials in the second recesses; and
   plating the second recesses to form conductive traces with substantially rectangular cross-sectional shapes.

6. The method of claim 2 comprising the steps of:
   pressing a conductive foil into at least a portion of the second recesses;
   shearing the conductive foil along edges of the second recesses;
   removing excess conductive foil not located in the second recesses; and
   plating the second recesses to form conductive traces with substantially rectangular cross-sectional shapes.

7. The method of claim 2 comprising plating a conductive material on one or more of the contact members and the circuit geometry.

8. The method of claim 1 comprising printing a compliant material in a location between the first dielectric layer and at least one of the contact pads.

9. The method of claim 1 comprising:
   printing at least one electrical device on a dielectric layer; and
   electrically coupling the electrical device to at least one contact member.

10. The method of claim 1 comprising configuring at least one of the contact pads to extend above the compliant printed circuit.

11. The method of claim 1 comprising the steps of:
    locating a plurality of semiconductor devices proximate the first surface of the compliant printed circuit; and
    wirebonding terminals on the semiconductor devices to the contact members on the compliant printed circuit.

12. A method of making an electrical assembly comprising the steps of:
    making the semiconductor package according to the method of claim 1; and
    electrically coupling a circuit member with a plurality of the contact pads on the second surface of the compliant printed circuit.

13. The method of claim 12 wherein the circuit member is selected from one of a dielectric layer, a printed circuit board, a flexible circuit, a bare die device, an integrated circuit device, organic or inorganic substrates, or a rigid circuit.

* * * * *